（12) United States Patent
Satou et al.

(10) Patent No.: US 9,558,810 B2
(45) Date of Patent: Jan. 31, 2017

(54) SEMICONDUCTOR DEVICE

(71) Applicant: TAIYO YUDEN CO., LTD., Tokyo (JP)

(72) Inventors: Masayuki Satou, Tokyo (JP); Mitsunori Katsu, Tokyo (JP); Hideaki Yoshida, Tokyo (JP); Hiroyuki Kozutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/375,748

(22) PCT Filed: Apr. 2, 2014

(86) PCT No.: PCT/JP2014/059702
§ 371 (c)(1),
(2) Date: Jul. 30, 2014

(87) PCT Pub. No.: WO2014/163098
PCT Pub. Date: Oct. 9, 2014

(65) Prior Publication Data
US 2016/0240243 A1 Aug. 18, 2016

(30) Foreign Application Priority Data

Apr. 2, 2013 (JP) ................. 2013-076775

(51) Int. Cl.
G11C 11/00 (2006.01)
G11C 11/418 (2006.01)
G11C 8/18 (2006.01)
G11C 11/419 (2006.01)
H03K 19/177 (2006.01)

(52) U.S. Cl.
CPC ............... *G11C 11/418* (2013.01); *G11C 8/18* (2013.01); *G11C 11/419* (2013.01); *H03K 19/177* (2013.01)

(58) Field of Classification Search
None
See application file for complete search history.

(56) References Cited

U.S. PATENT DOCUMENTS

2007/0109882 A1   5/2007   Taniguchi et al.

FOREIGN PATENT DOCUMENTS

JP   2006-172335 A   6/2006
JP   2013-219699 A   10/2013

*Primary Examiner* — Kretelia Graham
(74) *Attorney, Agent, or Firm* — Chen Yoshimura LLP

(57) ABSTRACT

A semiconductor device capable of reconfiguration, including a plurality of logic units which are connected to each other by an address line or a data line, wherein each of the logic units includes: a plurality of address lines; a plurality of data lines; a clock signal line to receive a system clock signal; a first and a second memory cell units which operate synchronously with the clock signal; a first address decoder which decodes an address signal and outputs a decode signal to the first memory cell unit; a second address decoder which decodes an address signal and outputs a decode signal to the second memory cell unit; and an address transition detection unit which generates an internal clock signal and outputs the internal clock signal to the first memory cell unit, when a transition of the address signal input from the plurality of address lines is detected, wherein the first memory cell unit operates synchronously with the internal clock signal, and the second memory cell unit operates synchronously with the system clock signal.

10 Claims, 23 Drawing Sheets

FIG.9

| A0 | A1 | A2 | A3 | D0 | D1 | D2 | D3 |
|----|----|----|----|----|----|----|----|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG.11

| A0 | A1 | A2 | A3 | D0 | D1 | D2 | D3 |
|----|----|----|----|----|----|----|----|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

FIG.14

| A0 | A1 | A2 | A3 | D0 | D1 | D2 | D3 |
|----|----|----|----|----|----|----|----|
| 0  | 0  | 0  | 0  | 0  | *  | 0  | *  |
| 1  | 0  | 0  | 0  | 0  | *  | 0  | *  |
| 0  | 1  | 0  | 0  | 0  | *  | 0  | *  |
| 1  | 1  | 0  | 0  | 1  | *  | 0  | *  |
| 0  | 0  | 1  | 0  | 0  | *  | 0  | *  |
| 1  | 0  | 1  | 0  | 0  | *  | 0  | *  |
| 0  | 1  | 1  | 0  | 0  | *  | 0  | *  |
| 1  | 1  | 1  | 0  | 0  | *  | 0  | *  |
| 0  | 0  | 0  | 1  | 0  | *  | 1  | *  |
| 1  | 0  | 0  | 1  | 0  | *  | 1  | *  |
| 0  | 1  | 0  | 1  | 0  | *  | 1  | *  |
| 1  | 1  | 0  | 1  | 1  | *  | 1  | *  |
| 0  | 0  | 1  | 1  | 0  | *  | 1  | *  |
| 1  | 0  | 1  | 1  | 0  | *  | 1  | *  |
| 0  | 1  | 1  | 1  | 0  | *  | 1  | *  |
| 1  | 1  | 1  | 1  | 0  | *  | 1  | *  |

SEMICONDUCTOR DEVICE

CROSS-REFERENCE TO RELATED APPLICATION

This application is a 371 application of an international PCT application serial no. PCT/JP2014/059702, filed on Apr. 2, 2014, which claims the priority benefit of the Japanese Patent Application No. 2013-076775, filed on Apr. 2, 2013, the entire contents of which are incorporated herein by reference.

TECHNICAL FIELD

The present invention relates to a semiconductor device, and especially to a system on chip device configured as a single chip, or a semiconductor device capable of reconfiguration.

BACKGROUND ART

As the integration of LSI is improved, an LSI referred to as an SoC (System on Chip) which is a microcomputer configured as a chip configuring a system on a silicon has been realized. The SoC mounts a memory inside the chip in many cases, and the storage capacity of a memory to be mounted thereon has been increased year after year.

In an ASIC (Application Specific Integrated Circuit) which is realized as an SoC and is designed and manufactured for a certain purpose, there are cases in which electric power saving design referred to as a voltage island is performed in order to reduce electric power consumption. The voltage island divides the circuit in the ASIC into a plurality of modules, controls a power gate circuit, and is capable of independently switching on and off of the electric power source for each divided individual modules. Further, the electric power source not being used is switched off, whereby the leak current of such module can be prevented. By using such technique, the electric power source of the most part of the circuit not being needed can be turned off, whereby the leak current of ASIC can be suppressed to the minimum amount.

PRIOR ART DOCUMENT(S)

Patent Literature(s)

Patent literature 1: Japanese Patent Application Laid-open Publication No. 2006-172335

SUMMARY OF THE INVENTION

Problems to be Solved by the Invention

As described above, the supply of electric power source to the modules not being used is stopped inside the SoC, whereby the electric power consumption is suppressed. However, in the case of SRAM (Static Random Access Memory), data which is being held is erased when the electric power source is turned off. Accordingly, when CPU (Central Processing Unit) accesses thereto, the voltage of the synchronous SRAM is raised, and when the CPU does not access thereto, the voltage of the synchronous SRAM is lowered to a retention level at which the cache content can be held.

In order to suppress such electric power consumption, a power gate circuit is introduced, and when there is no access, the electric power source is turned off, whereby the electric power is saved. However, when there is access, the electric power source normally stays on. In either way, the conventional technique requires complicated control from the CPU in order to reduce electric power consumption.

Further, a synchronous SRAM is used as the SRAM to be used for a cache memory. The address lines and various control signals operate in synchronization with a clock signal in the synchronous SRAM, whereby any one of the word lines is to be selected in accordance with the clock signal. On the other hand, in the asynchronous SRAM which operates without synchronization with the clock signal, the word lines are active even when there is no clock, whereby the electric power consumption is larger in comparison with the synchronous SRAM. Further, when the asynchronous SRAM is used for a cache memory of a CPU which performs pipe line processing, the reading out of data cannot be performed in a predetermined cycle, and pipe line stall occurs, and thus the asynchronous SRAM is not adopted thereto.

In order to solve the above mentioned problems, one embodiment of the present invention uses a storage unit which activates a word line without synchronization with the clock which synchronizes with a processor, whereby aims to suppress the electric power consumption of a system on chip device.

Means to Solve the Problems

Embodiments to solve the above mentioned problems are realized as a system on chip device shown in the following item sets.

1. A system on chip device characterized by comprising:
   a processor which executes calculation processing synchronously with a clock;
   a storage unit which operates asynchronously with the clock; and
   an address transition detection unit which detects a transition of an address output from the processor to the storage unit, wherein
   the address transition detection unit activates a word line of the storage unit which operates asynchronously, when the address transition detection unit detects the transition of the address.

2. The system on chip device according to item 1, wherein when the transition of the address is detected, the storage unit generates the clock in accordance with the address, and activates the word line synchronously with the generated clock.

3. The system on chip device according to item 1 or 2, wherein
   the storage unit includes a latch unit, and
   when the address transition detection unit does not detect the transition of the address, the storage unit outputs data held in the latch unit to the processor.

4. The system on chip device according to any one of items 1-3, further comprising a plurality of the storage units, wherein
   each of the plurality of storage units includes the address transition detection unit.

5. The system on chip device according to any one of items 1-4, wherein
   the storage unit is a programmable logic device configuring a logic circuit in accordance with configuration data, and the storage unit includes an address line for a memory and a data output line.

6. The system on chip device according to any one of items 1-5, wherein the storage unit is configured so as to operate as a logic circuit by storing truth value table data for outputting a logic calculation of an input value specified by a plurality of address lines to a data line, and/or to operate as a connection circuit by storing truth value table data for outputting an input value specified by a certain address line to a data line connected to an address line of another storage unit, the storage unit includes a first and a second memory cell units, the first memory cell unit is connected to a part of the plurality of address lines input to the storage unit, and the second memory cell unit is connected to the other part of the plurality of address lines input to the storage unit.

7. The system on chip device according to item 6, wherein the first and the second memory cell units store the truth value table data so as to output data in a first direction for an address input from the first direction, or to output data in a second direction for an address input from the second direction which is opposite to the first direction, and operate as the connection circuit.

8. The system on chip device according to item 6, wherein the first and the second memory cell units store the truth value table so as to output data in a second direction for an address input from a first direction, and operate as the connection circuit.

9. The system on chip device according to item 6, which outputs a plurality of data lines output from the storage unit to the other two storage units in a state of being divided with each other.

Effect of the Invention

One embodiment of the present invention uses a storage unit which is asynchronous with the clock which operates synchronously with a processor, whereby suppresses the electric power consumption of a system on chip device.

BRIEF DESCRIPTION OF THE DRAWINGS

FIG. 9 is a diagram showing a truth value table of the logic circuit shown in FIG. 8;

FIG. 11 is a diagram showing a truth value table of the connection element shown in FIG. 10;

FIG. 14 is a diagram showing a truth value table of the logic element and the connection element shown in FIG. 13;

MODES FOR CARRYING OUT THE INVENTION

Hereinbelow, a system on chip device is explained as a first embodiment of a semiconductor device, and subsequently a semiconductor device which is capable of reconfiguration is explained as a second embodiment of the semiconductor device, with reference to the drawings.

First Embodiment

System on Chip Device

[1] SoC

Figure 1:
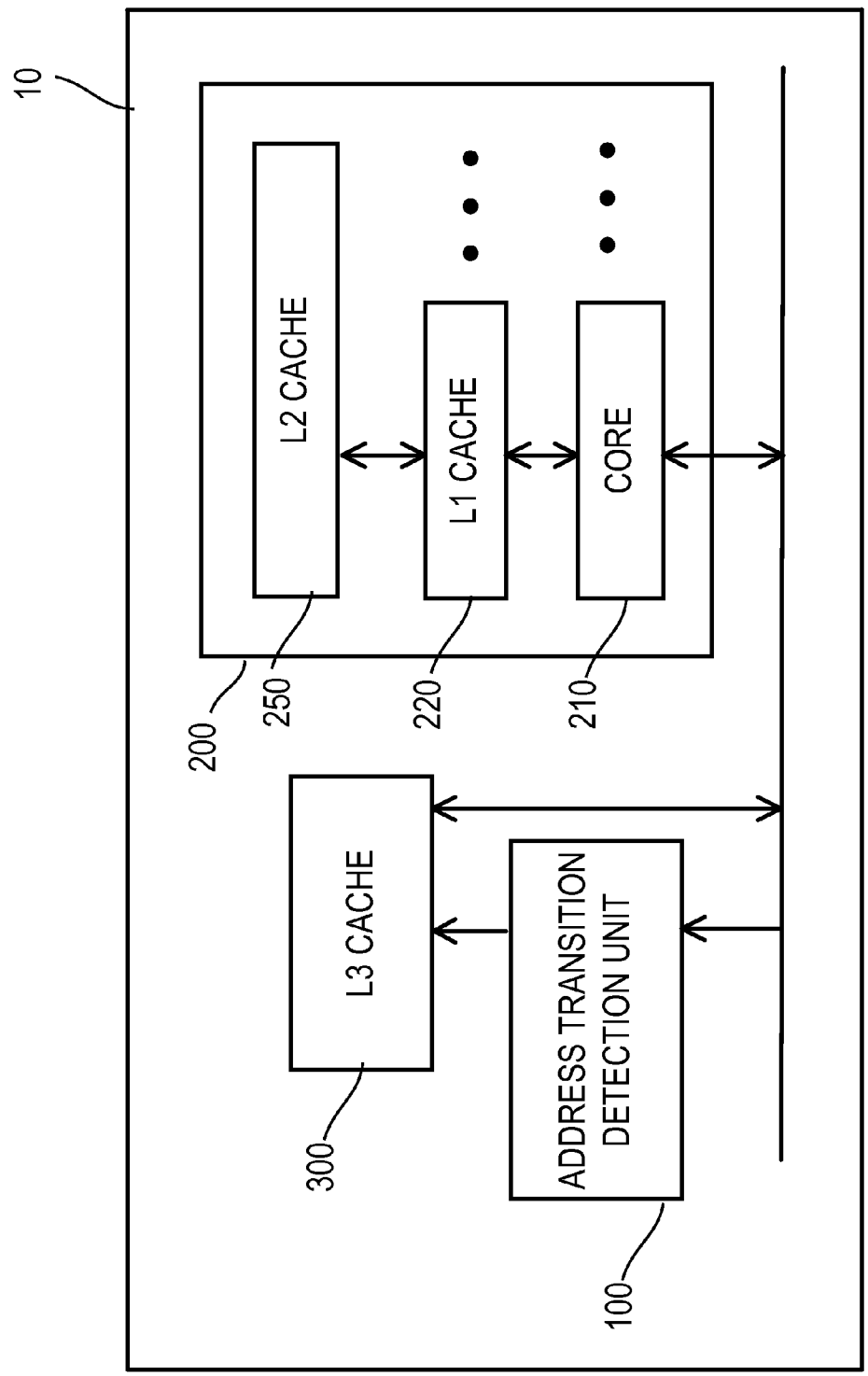
FIG. 1 is a diagram showing a configuration example of an SoC according to a first embodiment.

FIG. 1 is a diagram showing a configuration example of an SoC according to the present embodiment. An SoC 10 as the system on chip device shown in FIG. 1, for example, includes a processor 200 which is a CPU, a SRAM 300, and an address transition detection unit 100. Electric power is directly supplied to the processor 200 and a cache memory 300 from the electric power source VDD of the entire SoC 10. Further, a system clock is supplied to the processor 200, and the processor 200 includes at least one processor core 210 which executes calculation processing for the pipeline processing in synchronization with the clock; and L1 cache 220 for each processor core. The L1 cache 220 is a relatively small memory cache which is disposed nearest to the related processor core, and is configured so as to give high speed access of instructions and data to the related processor core 210.

In the pipeline system, the processor includes a plurality of pipelines (an instruction control pipeline, a calculation pipeline, a branch control pipeline, and the like) to realize functions. Further, each pipeline is divided into a plurality of stages. Each stage includes circuit units to realize certain steps, and operates so as to finish the certain steps allotted to each stage in a period of time which is referred to as a cycle time obtained as an inverse number of operation frequency. Further, the output signal of a stage in the prior step is, for example, used as an input signal of the stage in the posterior step.

The processor 200 may still further include at least one L2 cache 250. The L2 cache 250 is relatively bigger than the L1 cache 220, is related to one or a plurality of L1 caches, and is configured so as to supply data to the one or the plurality of the related L1 caches. For example, the processor core 210 requests data not included in the related L1 cache from the L2 cache 250. Accordingly, the data requested by the processor core 210 is detected from the L2 cache 250, and is saved in the L1 cache related to the processor core 210. In one embodiment of the present invention, the L1 cache 210 and the L2 cache 220 may be SRAM based apparatuses.

When cache miss occurs in the L2 cache 250, the data requested by the processor core 210 can be detected from the cache memory 300. In FIG. 1, the cache memory 300 is L3 cache, although in a processor 200 which does not include the L2 cache 250, the cache memory 300 corresponds to the L2 cache. The L3 cache 300 is relatively bigger than the L1 cache 220 and the L2 cache 250. Although a single L3 cache 300 is shown in FIG. 1, a plurality of L3 caches 300 may be implemented.

The L1 cache 210 may be related to a plurality of L2 caches 250, and may be configured so as to exchange data between related L2 caches 250. One or a plurality of high level caches, for example, L4 cache may be included in SoC 10. Each high level cache can also be related to one or a plurality of caches of the next lower level.

Note that although the number of L3 cache 300 shown in FIG. 1 is one, a plurality of L3 caches 300 may be included.

[2] Cache Memory

Figure 2:
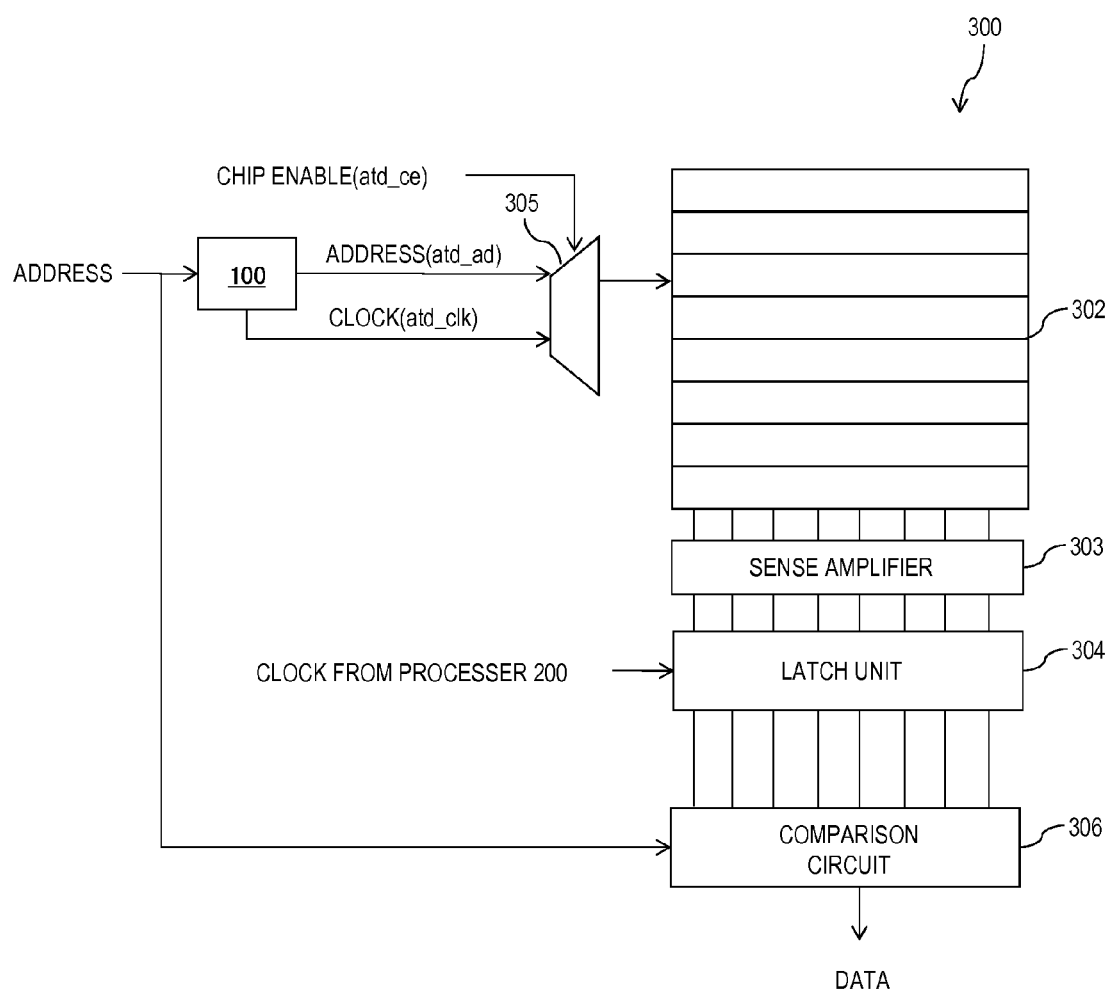
FIG. 2 is a circuit diagram showing a cache memory.

FIG. 2 a circuit diagram showing the cache memory. The cache memory 300 is a memory which operates asynchronously with the clock, and for example is a SRAM. The cache memory 300 includes an address transition detection unit 100, a memory cell 302, a sense amplifier 303, a latch unit 304, a decoder 305, and a comparison circuit 306.

The cache memory 300 has in the prior stage of the decoder 305, an address transition detection unit 100. When the address transition detection unit 100 receives an address signal, the address transition detection unit 100 generates a clock (atd_clk). Further, the address transition detection unit 100 is configured so that when the address transition detection unit 100 detects an address transition, the decoder 305 operates in synchronization with the clock. When the address transition detection unit 100 does not detect an address transition, a clock (atd_clk) is not generated, the cache memory 300 does not operate, and thus the electric power can be saved. In that case, the data held in the latch unit 304 is output to the processor 200 in accordance with the clock from the processor 200.

When the address transition detection unit 100 detects an address transition, the address transition detection unit 100 outputs a chip enable signal (atd_ce) of signal level "Low", and inputs the clock (atd_clk). The word line is activated only during such Hi period, whereby the decoder 305 decodes the address (atd_ad), and the word line specified by the decode signal is activated. The memory cell connected to the activated word line changes the potential of a column line which is not shown. The sense amplifier 303 detects a signal in which the potential changes of the column line are amplified, whereby the latch unit 304 holds bits.

The comparison circuit 306 compares a tag output from the sense amplifier 303 with a tag of the physical address. When the two tags are consistent with each other (which hereinbelow is referred to as "cache hit"), the data held in the latch unit 305 is output to the processor 200 in accordance with the output of the decoder 305 which is synchronous with the clock (atd_clk). When the tags are inconsistent with each other (which hereinbelow is referred to as "cache miss"), a cache miss signal is output to the processor 200.

Note that by the output of the decoder 305, the address and the clock are output to the cache memory 300 in a state where the input of the clock is delayed. Such timing is described later with reference to FIG. 4.

Further, although one cache memory 300 is shown in FIG. 2, a plurality of cache memories may be included. When there are a plurality of cache memories 300, the address supplied from the processor 200 is supplied to the plurality of cache memories 300, and the cache memories 300 which are in the state of cache hit output data specified by the address to the processor 200.

[3] Address Transition Detection Unit

Figure 3:
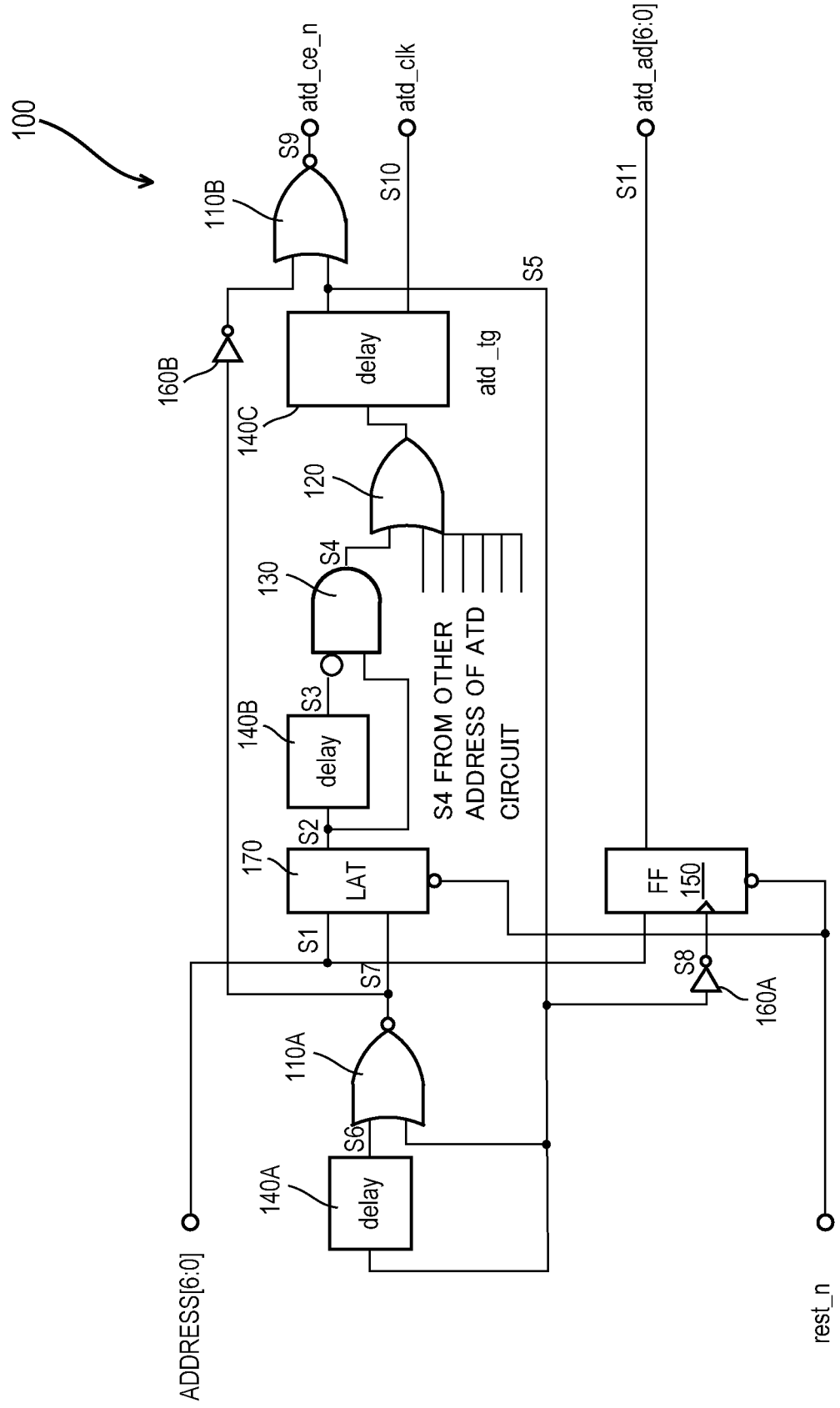
FIG. 3 is a circuit diagram showing an address transition detection unit according to the present embodiment.

FIG. 3 is a circuit diagram showing the address transition detection unit according to the present embodiment. The address transition detection unit 100 shown in FIG. 2 includes negative logical add (NOR) circuits 110A, 110B, a logical add (OR) circuit 120, an exclusive logical add (EOR) circuit 130, delay circuits 140A-140C, a flip flop (FF) 150, an inverter 160B, and D latch 170.

Figure 4:
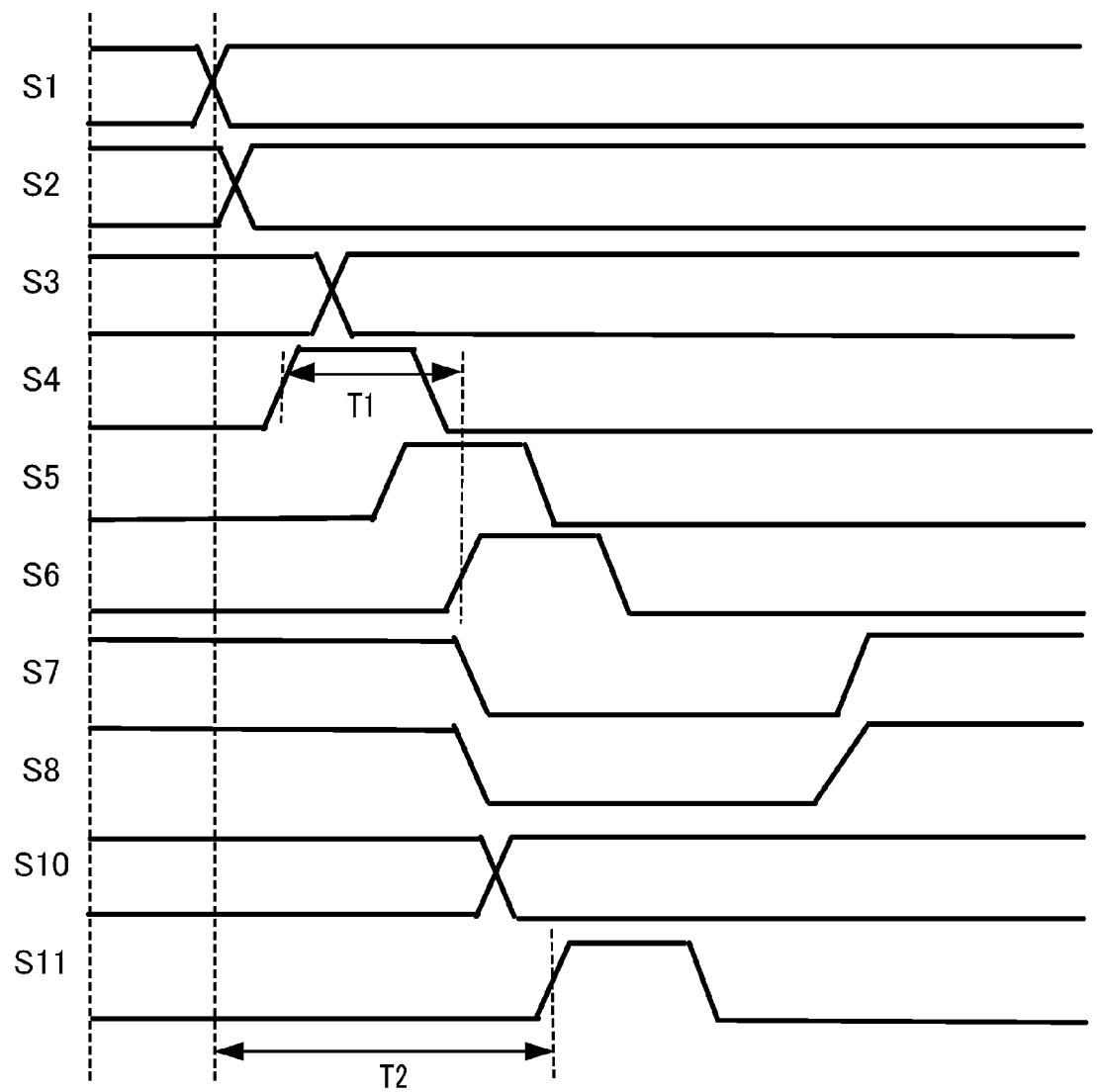
FIG. 4 is a timing chart of signals of the address transition detection shown in FIG. 3.

FIG. 4 is a timing chart of signals of the address transition detection shown in FIG. 3. Hereinbelow, the circuit operation of the address transition detection is described by explaining FIGS. 3 and 4.

Signal S1 is an address input signal output from the processor. Signal S2 is an output of the D latch. When there is change in the signal S1, the D latch 170 latches the signal so that the same does not change for a certain amount of period. This is to ignore subsequent address transition by noises, and the like.

Signal S3 is a delay signal output from the D latch 170. The delay signal generates a clock at the time of rising and falling as shown in FIG. 3, and generates a clock width of signal S4, whereby delaying at the delay circuit 140B.

Signal S4 generated as the clock signal detects changes, and is output from EOR 130. The input and output of the delay circuit 140B are input to the EOR 130, whereby when the signal levels of the input and the output are different, the EOR 130 outputs the signal level of "high". Accordingly, the address transition can be detected. The period T1 of S4 shown in FIG. 4 indicates the time from the change detection of the logic address to the loading of FF, and period T2 indicates the time from the change detection of the logic address to the reading out of the memory cell unit.

In the OR circuit 120, signal S4 as well as signals of other address transition are input, and OR calculation value is output. The output of the OR circuit 120 is delayed by the delay circuit 140C, and signal S5 is output.

Signal S5 is a delay signal output from the delay circuit 140C, waits for the enable signal of LAT 170 and performs a clock input.

Signal S6 is a signal extension of signal S5, and is a pulse generation of the enable signal. The NOR circuit 110A outputs signal S7 which is an NOR calculation value of signals S5 and S6. Then, the signal S7 becomes the enable signal of D latch 170. Signal S8 is a signal obtained by inverting signal S5 by the inverter 160A, and is used as a clock of the latch of the address signal at FF 150. Signal S9 is used as an enable signal of the storage unit 200 disposed in the posterior stage, signal S10 is used as the clock (atd_clk) of the storage unit 200, signal S11 is used as the address of the storage unit 200. The signal S10 shown in FIG. 4 shows the period of time from the change detection of logic address to the reading of the memory.

When data of the processor core 210 is requested in this manner, the clock is generated with the address changes, and the memory is driven. Accordingly, the memory operates when necessary, and the memory does not operate when not necessary, whereby the electric power consumption can be reduced automatically.

[4] Usage of Reconfigurable Logic Device

Using the above mentioned cache memory as a reconfigurable device is a good example of using semiconductor resources effectively.

Logic device capable of reconfiguration is referred to as an MRLD (Memory based Reconfigurable Logic Device) (Registered trademark). MRLD is similar to "MPLD (Memory-based Programmable Logic Device)" (Registered trademark) which realizes circuit configuration by memory cell units developed by the applicant in that each MLUT is directly connected to each other without wiring elements disposed therebetween. However, the MRLD is distinguished from MPLD in that the function of synchronous SRAM supplied as memory IP is effectively utilized. Note that although not shown in the description hereinbelow, the MLUT includes an address transition detection unit, and is non-synchronized even by the synchronous SRAM. Accordingly, at the same time as the non-synchronization, input signal is not input to blocks not configuring logic, and the address transition does not occur, whereby the electric power can be reduced. The block configuring logic is input with an input signal, and clock is generated, whereby a certain logic value can be output therefrom.

Hereinbelow, examples in which MRLD is applied to cache memory is described, in the order of 4.1 The entire configuration of MRLD, 4.2 Multidirectionally disposed MLUT, 4.3 Logic operation of MLUT, and 4.4 Bidirectionally disposed MLUT.

Figure 5:
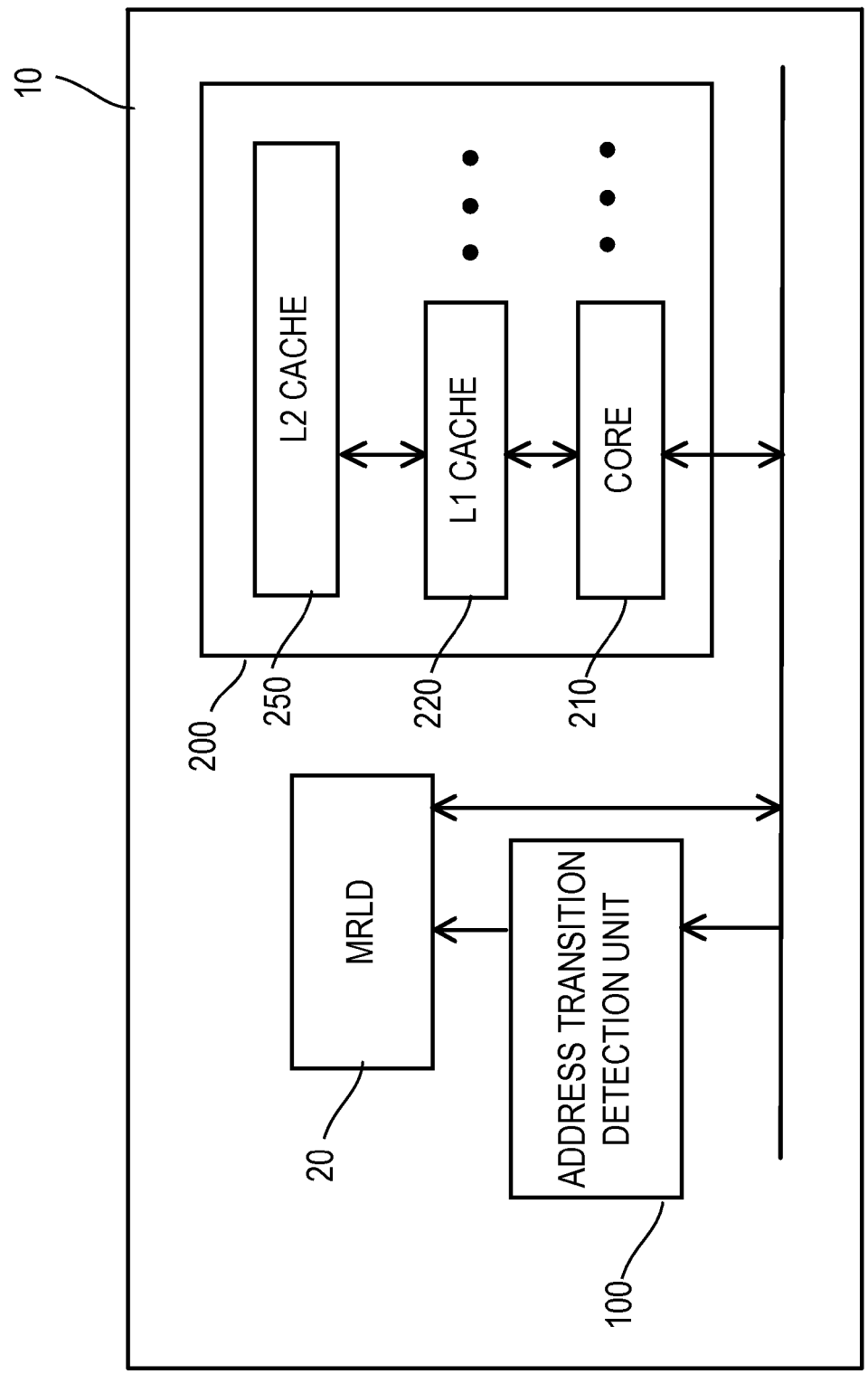
FIG. 5 is one example of SoC in which MRLD is used as a cache memory.

FIG. 5 is one example of SoC in which MRLD is used as a cache memory. Although one MRLD is shown in FIG. 5, a plurality of MRLDs may be provided as described with reference to FIG. 2.

4.1 the Entire Configuration of MRLD

Figure 6A:
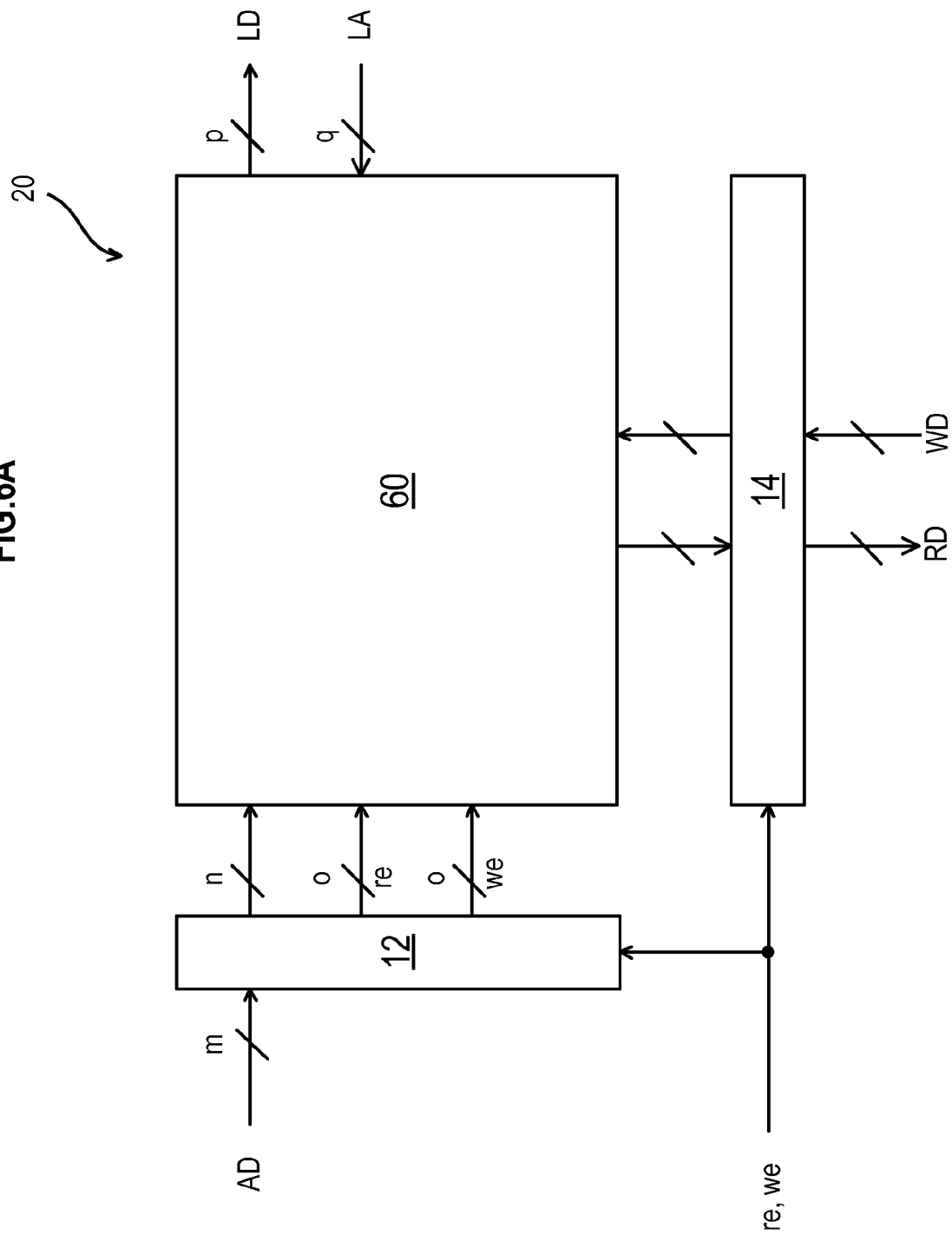
FIG. 6A is a diagram showing a first example of the entire configuration of a semiconductor device according to the present embodiment.

Number 20 as shown in FIG. 6A is an example of MRLD. The MRLD 20 has MLUT array 60 on which MLUTs realized by a plurality of synchronous SRAM are disposed, raw decoder 12 which is responsible for memory read operation and memory write operation, and column decoder 14.

The MLUT 30 is configured by synchronous SRAM. By writing data regarded as truth table in the memory cells of SRAM, the MLUT operates as a logic element, or connection element, or the logic element and the connection element.

The logic operation of the MRLD 20 operates logic address LA and logic data LD as shown by continuous line. The logic address is used as input signal of logic circuit. Further, the logic data is used as output signal of logic circuit. The logic address LA of MLUT 30 is connected to data line for logic operation data LD of adjacent the MLUT.

The logic of the logic operation of the MPLD 20 may be realized by the truth table data stored in the MLUT 30. Some of the MLUTs 30 operate as a logic element of a combination circuit of AND circuit, an adder, and the like. The other MLUTs operate as a connection element which connects the MLUTs 30 there between realizing the combination circuit. Rewriting of the truth table data to realize the logic element and the connection element is performed by the reconfiguration of the above described memory operation.

The write operation is done by write address AD and write data WD, and the read operation is done by write address AD and read data RD.

The write address AD is an address indication the memory cell in the MLUT 30. The write address AD specifies the memory cells of the m power of two by m signal lines. The raw decoder 12 receives the MLUT address via m signal lines, and decodes the MLUT address to select and specify the subject memory cell. Please note that, in the embodiment, the logic operation address LA is decoded by a decoder in MLUT.

The raw decoder 12 decodes x bits of m bits of write address AD in accordance with control signals such as read enable signal re and write enable we, and outputs decoded address n to MLUT 30. The decoded address n is utilized as an address indicating a memory cell in MLUT 30.

The column decoder 14 has a same functionality of raw decoder 12, decodes y bits of m bits of write address AD and then outputs decoded address to the MLUT 30, and outputs the write data WD and inputs the read data RD.

Also, in case the array of MLUT is expressed by s-by-t matrix, n*t bit data is inputted to the decoder 12 from the MLUT array 60. Therein, in order to select the MLUT per each line, the row decoder outputs re and we of o lines. That is, the o line corresponds to s line. Here, when one bit of o bits is activated, a word line of specified memory cells. Further, the date n*t bits is selected from the MLUT arrays 60, to output n bit data from t units of MLUTs is selected from data n*t bits, from which one row is selected by row decoder 14.

4.2 Multidirectionally Disposed MLUT

Figure 6B:
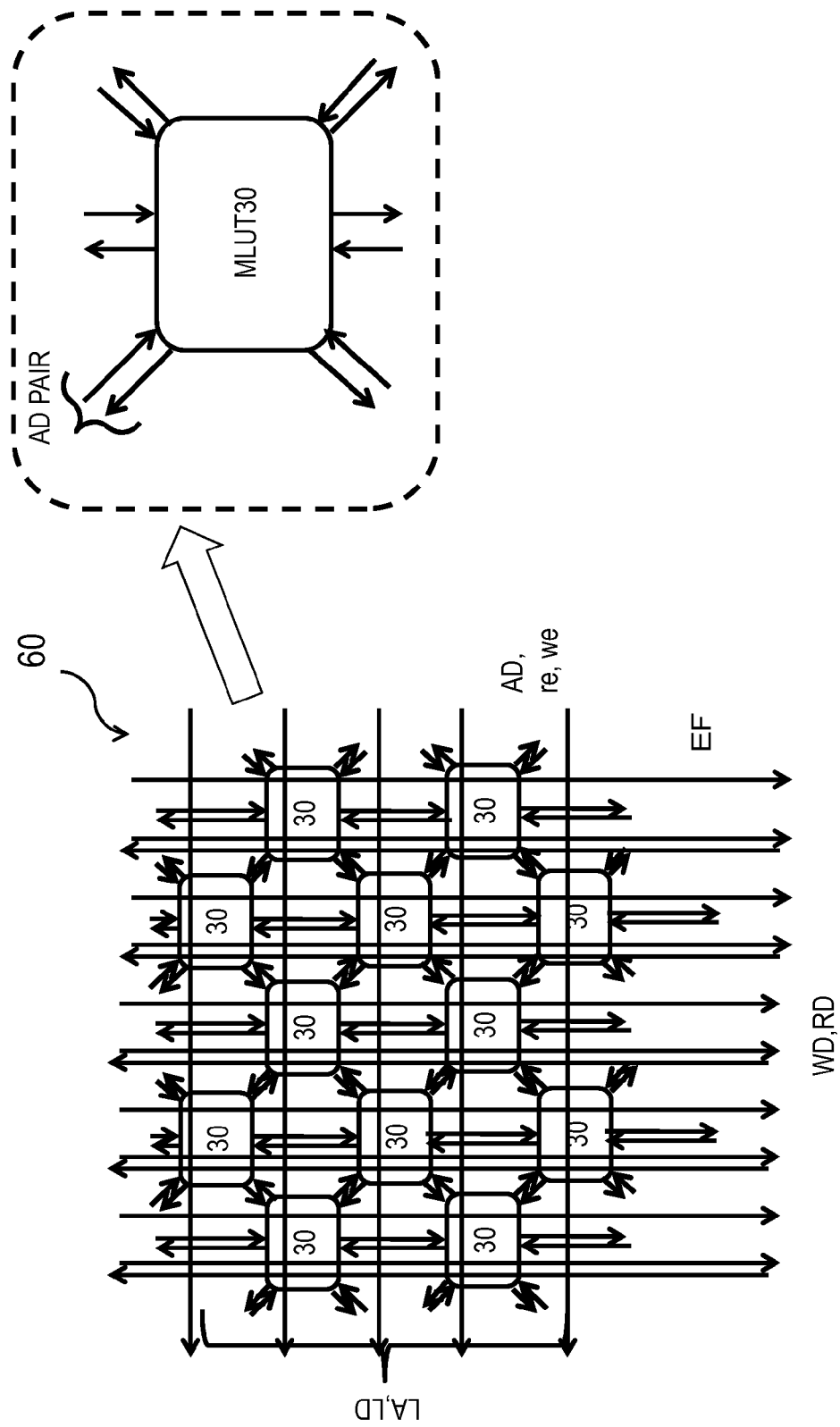
FIG. 6B is a diagram showing one example of an MLUT array.

FIG. 6B is a diagram showing one example of an MLUT array. As shown, the MLUT array 60 is what MLUT 30 disposed. The bit width of the memory used as MLUT 30 is same that of data width. As shown in right upper of FIG. 6B, one address and one data is paired, and thereby the pseudo bidirectional signal line is formed. The pseudo bidirectional signal will be called as "AD pair". By utilizing the memory which data bit width and address bit width are "N" bits, the MLUT having number of N AD pairs are realized. The logic operation of the MRLD is implemented in the data stored in the memory of MLUT which regarded as a truth table.

4.3 the Logic Operation of MLUT

A. Logic Element

Figure 7:
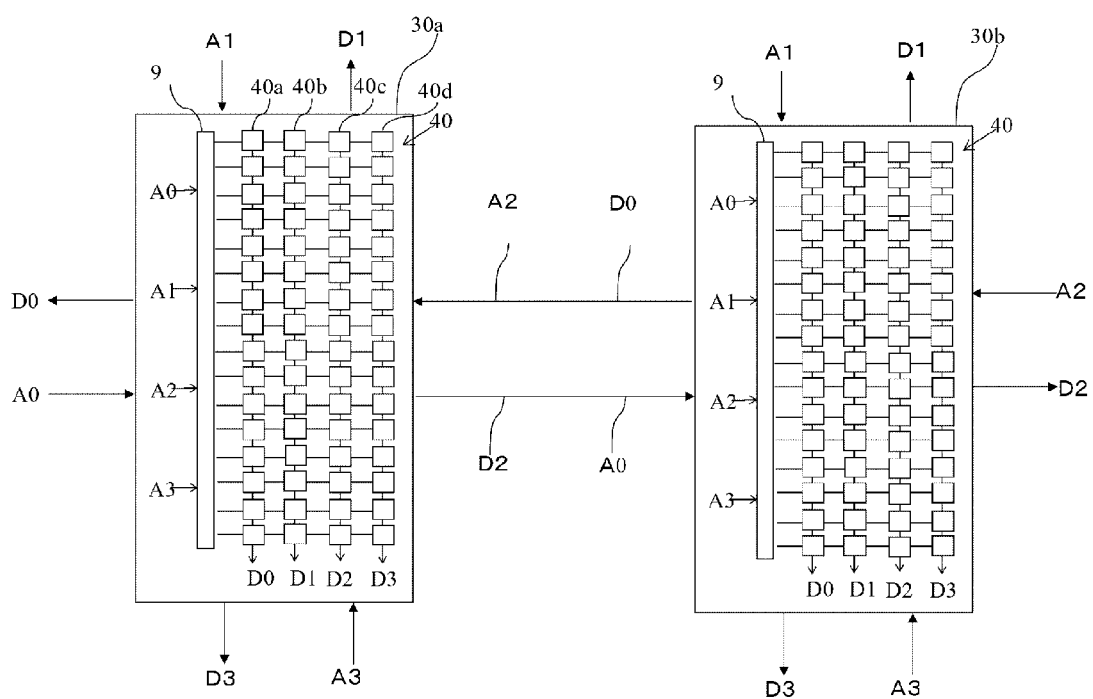
FIG. 7 is a diagram showing one example of an MLUT.

FIG. 7 is a view showing one example of the MLUT which operates as a logic element. The address switching circuit 10a and the output data switching circuit 10B are omitted for simplifying the explanation. The MLUTs 30A, 30B shown in FIG. 7 have four number of logic address lines A0~A3, four number of logic operation data lines D0~D3, 4×16=64 number of storage elements 40, and an address decoder 9 respectively. The logic operation data lines D0~D3 connect serially 24 number of storage elements 40 respectively. The address decoder 9 is configured to select four number of storage elements which are connected to either 16 number of word lines according to signals entered into the logic address lines A0~A3. These four storage elements are respectively connected to the logic operation data lines D0~D3 and output data memorized in the storage element to the logic operation data lines D0~D3. For instance, it may be configured to select four storage elements 40A, 40B, 40C, and 40D in case of appropriate signals entered into the logic address lines A0~A3. Here, the storage element 40A is connected to the logic operation data line D0. The storage element 40B is connected to the logic operation data line D1. The storage element 40D is connected to the logic operation data line D2. The storage element 40D is connected to the logic operation data line D3. And, the signals which are memorized in the storage elements 40A-40D are outputted to logic operation data lines D0~D3.

Therefore, the MLUTs 30A, 30B receive logic addresses from the logic address lines A0~A3 and output as logic operation data, which are values memorized in the four storage elements 40 selected by the address decoder 9 according to the logic addresses, to the logic operation data lines D0~D3 respectively. Note that the logic address line A2 of the MLUT 30A is connected to the logic operation data line D0 of adjacent the MLUT 30B. The MLUT 30A receives data as the logic address output from the MLUT 30B. And, the logic operation data line D2 of the MLUT 30A is connected to the logic address line A0 of the MLUT 30B. The MLUT 30B receives data as the logic address output from the MLUT 30A. For instance, the logic operation data line D2 of the MLUT 30A outputs a signal, which is memorized in any one of 24 number of storage elements connected to the logic operation data line D2, to the logic address A0 of the MLUT 30B in accordance with signals entering into the logic address lines A0~A3 of MLUT 30A. Similarly, the logic operation data line D0 of the MLUT 30B outputs a signal, which is memorized in any one of 24 number of storage elements connected to the logic operation data line D0, to the logic address A2 of the MLUT 30A in accordance with signals entering into the logic address lines A0~A3 of the MLUT 30B. In this manner, one pair of the address line and the data line is used for connecting the MPLDs with each other.

Note that the number of AD pairs included in the MLUTs 30A, 30B shown in FIG. 7 is four. However, the number of the AD pairs is not limited to four, as described later.

Figure 8:
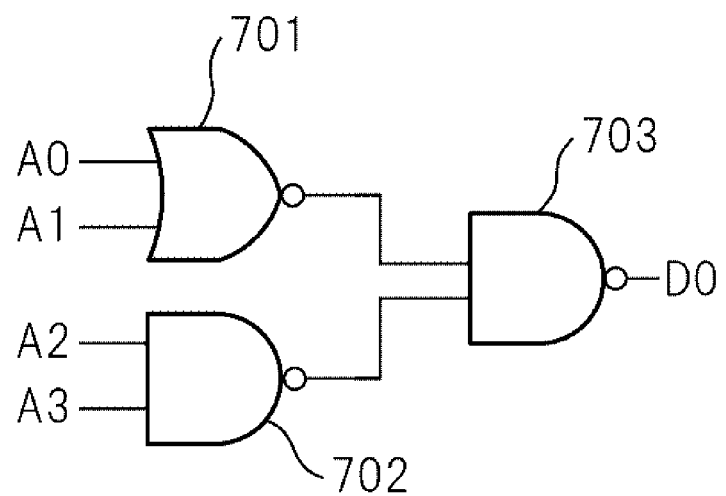
FIG. 8 is a diagram showing one example of an MLUT which operates as a logic circuit.

FIG. 8 is a view showing one example of the MLUT which operates as a logic circuit. In this example, the logic circuit is configured in the following manner. That is, the logic address lines A0 and A1 are inputs of a 2-input NOR circuit 701, and the logic address lines A2 and A3 are inputs of a 2-input NAND circuit 702. Further, an output of the 2-input NOR circuit 701 and an output of the 2-input NAND circuit 702 are inputted to a 2-input NAND circuit 703, and an output of the 2-input NAND circuit 703 is outputted to the logic operation data line D0.

FIG. 9 is a view showing a truth table of the logic circuit of FIG. 8. Since the logic circuit of FIG. 8 has four inputs, all inputs from the inputs A0-A3 are used as inputs. On the other hand, since the logic circuit only has one output, only the output D0 is used as an output. In each field for the outputs D1-D3 in the truth table, "*" is described. This means that the value may take either "0" or "1". However, when actually writing in the truth table data into the MLUT for reconfiguration, either one value of "0" or "1" needs to be written into these fields.

B. Connection Element

Figure 10:
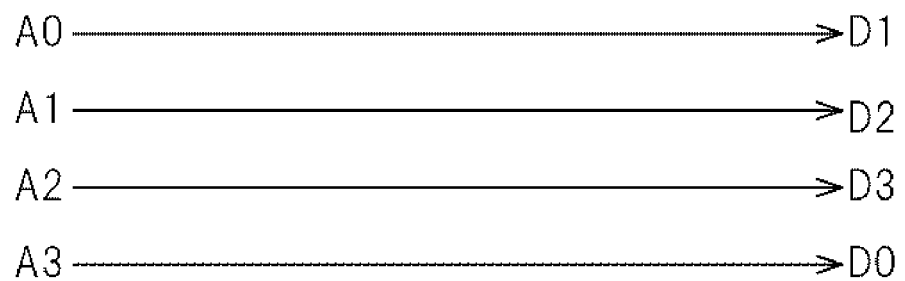
FIG. 10 is a diagram showing one example of an MLUT which operates as a connection element.

FIG. 10 is a view showing one example of the MLUT which operates as a connection element. In FIG. 10, the MLUT as the connection element operates to output a signal of the logic address line A0 to the logic operation data line D1, output a signal of the logic address line A1 to the logic operation data line D2, and output a signal of the logic address line A2 to the logic operation data line D3. The MLUT as the connection element further operates to output a signal of the logic address line A3 to the data line D1.

FIG. 11 is a view showing a truth table of the connection element of FIG. 10. The connection element shown in FIG. 10 has four inputs and four outputs. Accordingly, all inputs from the inputs A0-A3 and all outputs to the outputs D0-D3 are used. The MLUT operates as a connection element which outputs the signal of the input A0 to the output D1, outputs the signal of the input A1 to the output D2, outputs the signal of the input A2 to the output D3, and outputs the signal of the input A3 to the output D0, in accordance with the truth table shown in FIG. 11.

Figure 12:
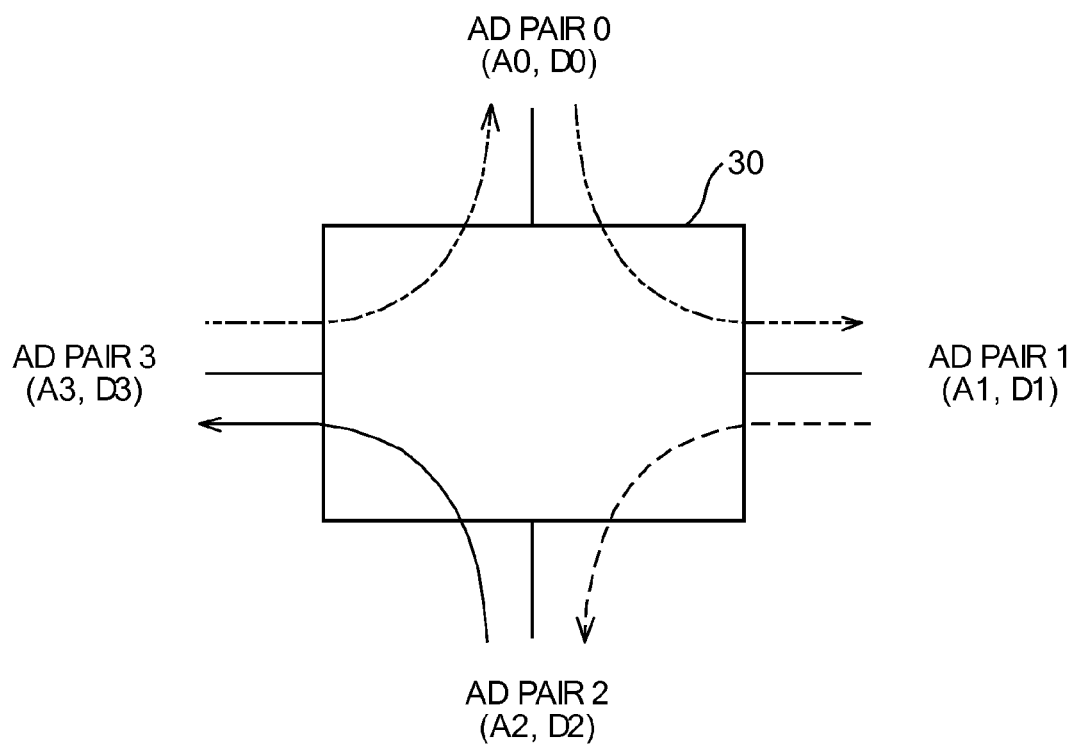
FIG. 12 is a diagram showing one example of a connection element which is realized by an MLUT having four AD pairs.

FIG. 12 is a view showing one example of the connection element realized by the MLUT including four AD pairs. AD0 comprises the logic address line A0 and the logic operation data line D0. AD1 comprises the logic address line A1 and the logic operation data line D1. AD2 comprises the logic address line A2 and the logic operation data line D2. And, AD3 comprises the logic address line A3 and the logic operation data line D3. A chain line illustrated in FIG. 12, shows signal flow that a signal, which is entered into the logic address line A0 of the AD pair 0, is output to the logic operation data line D1 of the AD pair 1. A two-dot chain line illustrated in FIG. 12, shows signal flow that a signal, which is entered into the logic address line A1 of the second AD pair 1, is output to the logic operation data line D2 of the AD pair 2. A dash line shows signal flow that a signal, which is entered into the logic address line A2 of the AD pair 2, is output to the logic operation data line D3 of the AD pair 3. A solid line shows signal flow that a signal, which is entered into the logic address line A3 of the AD pair 3, is output to the logic operation data line D0 of the AD pair 0.

Note that although the MLUT 30 comprises the four number of the AD pairs shown in FIG. 12, the number of the AD pairs is not especially limited the number of four.

C. Combination Function of Logic Element and Connection Element

Figure 13:
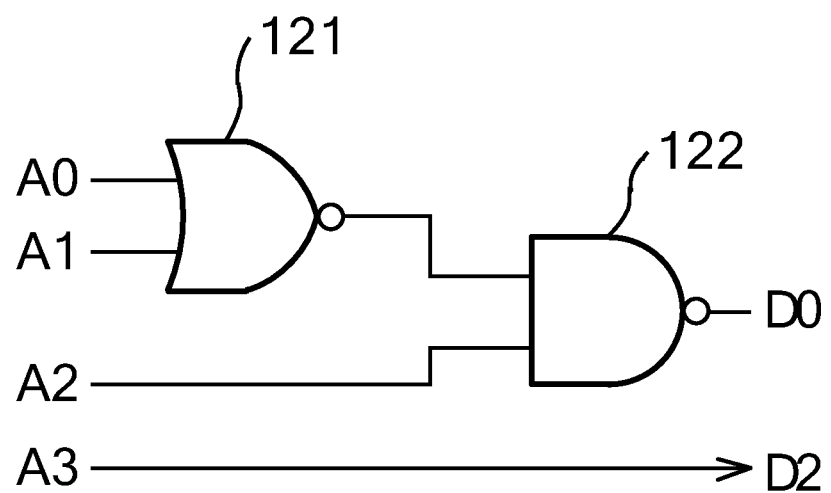
FIG. 13 is a diagram showing one example in which one MLUT operates as a logic element and a connection element.

FIG. 13 is a view showing one example of a single MLUT which operates as the logic element and the connection element. In the example shown in FIG. 13, the logic circuit is configured in the following manner. That is, the logic address lines A0 and A1 are inputs of a 2-input NOR circuit 121, an output of the 2-input NOR circuit 121 and the logic address line A2 are inputs of a 2-input NAND circuit 122, and an output of the 2-input NAND circuit 122 is outputted to the data line D0. Further, at the same time, a connection element which outputs the signal of the logic address line A3 to the logic operation data line D2 is configured.

FIG. 14 is a view showing a truth table of the logic element and the connection element of FIG. 13. The logic operation of FIG. 13 uses inputs D0~D3 as three inputs, and one output D0 as an output. On the other hand, the connection element of FIG. 14 configures a connection element which outputs the signal of the input A3 to the output D2.

Figure 15:
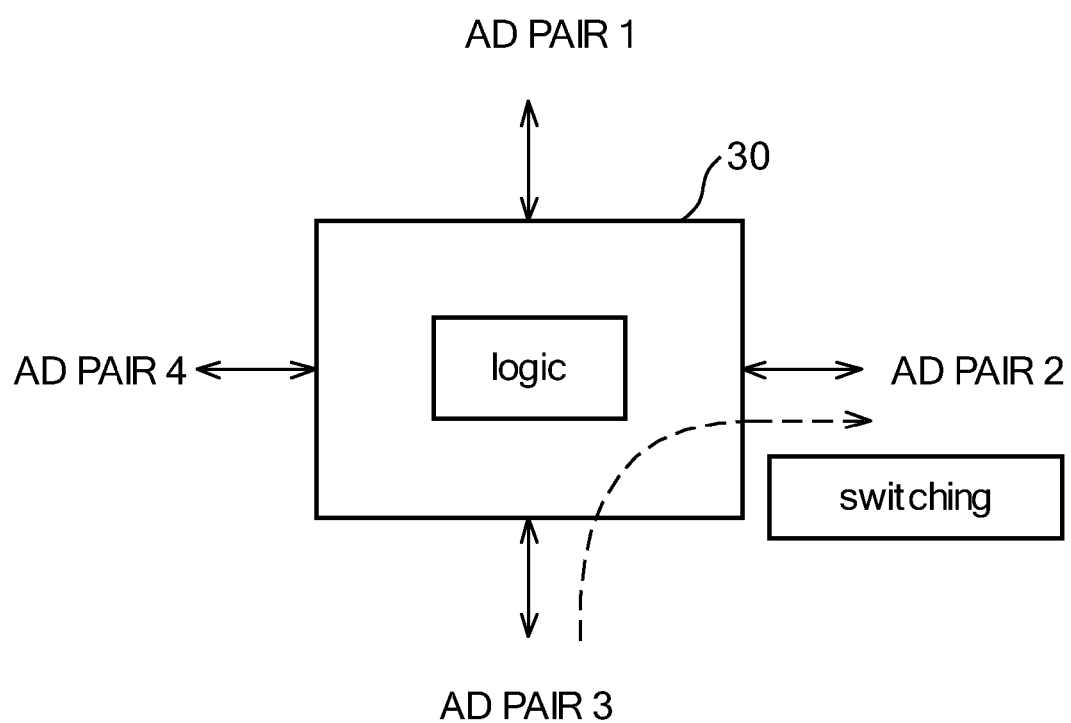
FIG. 15 is a diagram showing one example of the logic operation and the connection element realized by an MLUT having an AD pair.

FIG. 15 is a view showing one example of the logic operation and the connection element realized by the MLUT including the AD pairs. Along with the MLUT shown in FIG. 12, AD0 comprises the logic address line A0 and the logic operation data line D0. AD1 comprises the logic address line A1 and the logic operation data line D1. AD2 comprises the logic address line A2 and the logic operation data line D2. And, AD3 comprises the logic address line A3 and the logic operation data line D3. As described above, the MLUT 30 realizes two operations of the logic operation (three inputs and one output) and the connection element (one input and one output) by a single MLUT 30. Concretely, the logic operation uses the logic address line A0 of the AD pair 0, the logic address line A1 of the AD pair 1, and the logic address line A2 of the AD pair 2 as the inputs. And, the address line of the logic operation data line D0 of the AD pair 0 is used as the output. Also, the connection element outputs the signal inputted to the logic address line A3 of the AD pair 3 to the logic operation data line D2 of the AD pair 2 as shown in a dashed line.

4.4 Bidirectionally Disposed MLUT

Figure 16:
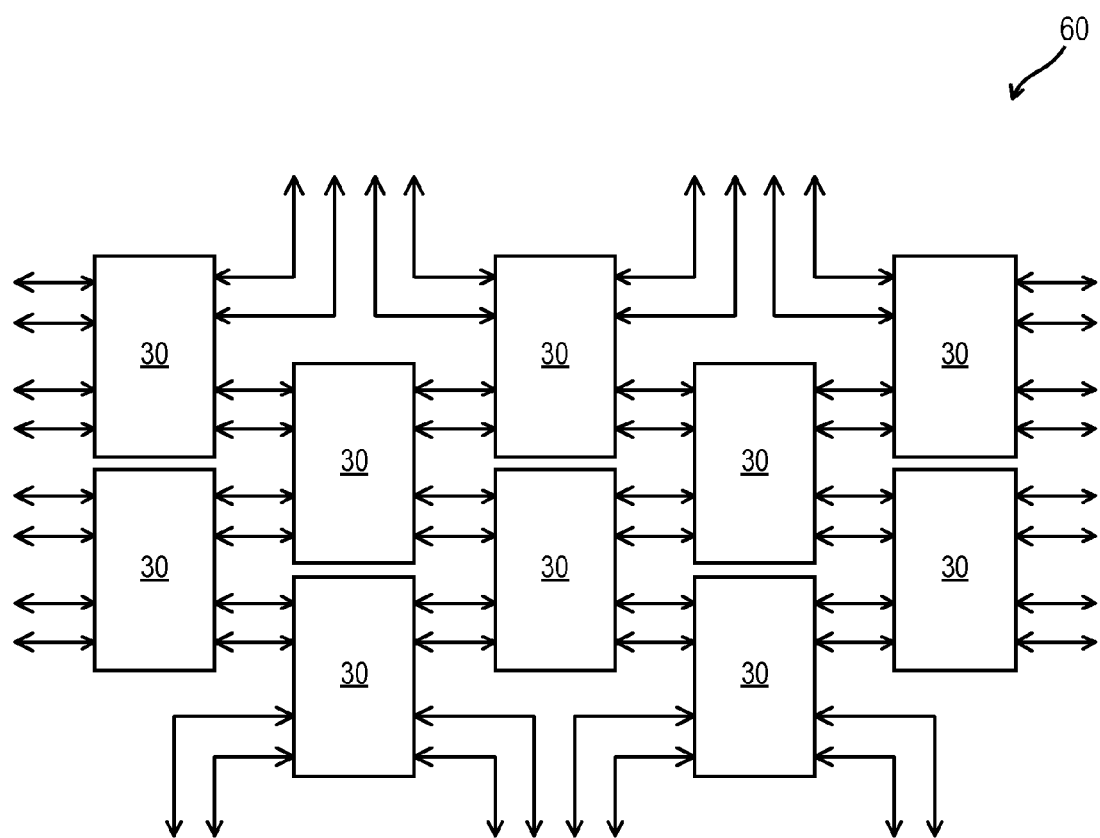
FIG. 16 is a diagram schematically showing an MLUT which is configured by horizontally laying MLUT of two memory cell units.
Figure 17:
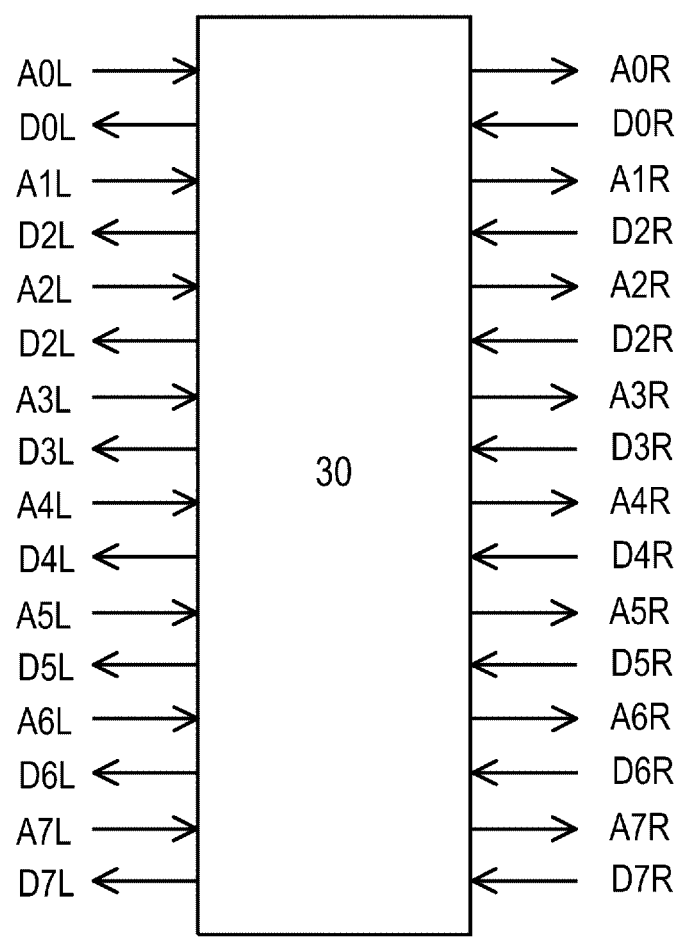
FIG. 17 is a diagram showing one example of an MLUT which uses large capacity memory.

FIG. 16 is a diagram schematically showing an MLUT which is configured by horizontally laying MLUT of two memory cell units. The MLUT 30 as shown in FIG. 16 has inputs indicated by addresses A0L to A7L from left side as shown in FIG. 17, inputs indicated by addresses A0R to A7R from right side as shown in FIG. 17, outputs indicated by addresses D0L to D7L to left side as shown in FIG. 17, and outputs indicated by addresses D0L to D7L to right side as shown in FIG. 17. The conventional MLUT as defined by "N value is equal to eight" has a 1 M bit memory, 4 M bit in CLB and therefore large. In contrast, the embodiment is configured by 8K (256 word×16 bit×2 MLUT) as described below.

FIG. 17 is a diagram showing one example of an MLUT which uses large capacity memory.

Figure 18:
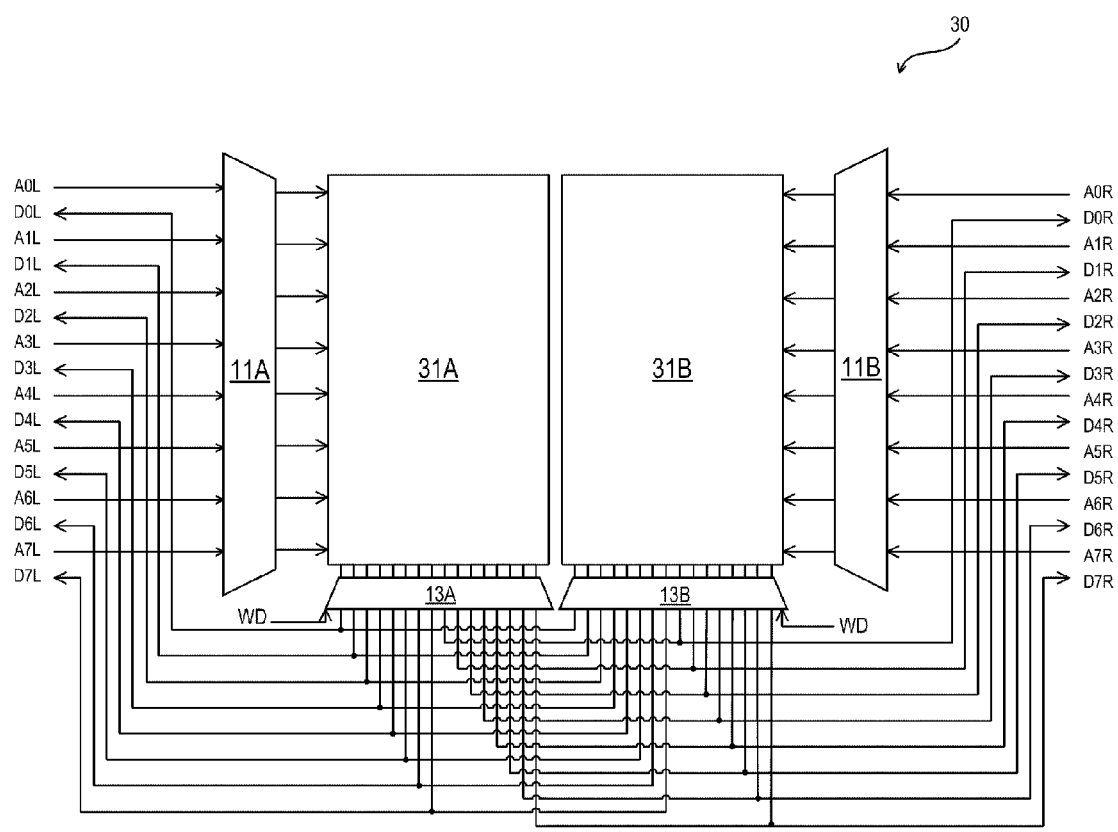
FIG. 18 is a diagram showing an example of a circuit of the MLUT shown in FIG. 17.

FIG. 18 is a diagram showing an example of a circuit of the MLUT shown in FIG. 17. The MLUT 30 shown in FIG. 18 includes a memory cell unit 31A and 31B. The memory cell unit is, for example, a SRAM. As shown in FIG. 18, the memory cell unit 31A is specified by a first plurality of address lines from one side, and includes a plurality of memory cells which output data to a first plurality of data lines, the number of which being twice as much as the first plurality of address lines. The memory cell unit 31 B is specified by a second plurality of address lines from another side, and includes a plurality of memory cells which output data to a second plurality of data lines, the number of which being twice as much as the second plurality of address lines. The MLUT 30 outputs a part of the first plurality of data lines and the second plurality of data lines to one side, and outputs another part of the first plurality of data lines and the second plurality of data lines to another side.

Each memory cell unit stores the truth value table data in the memory cells for each direction. Accordingly, each of the memory cell units 31A and 31B stores the truth value table data for a direction from right to left, and the truth value table data for a direction from left to right, respectively. That is to say, the MLUT stores two pieces of truth value table data each of which defining a certain data output direction.

The number of pieces of data of each memory cell unit is increased so as to be more than the number of addresses, and the direction of data output from each memory cell unit is made bidirectional, whereby the necessary memory cells can be decreased, and bidirectional data output can be made possible.

Figure 19:
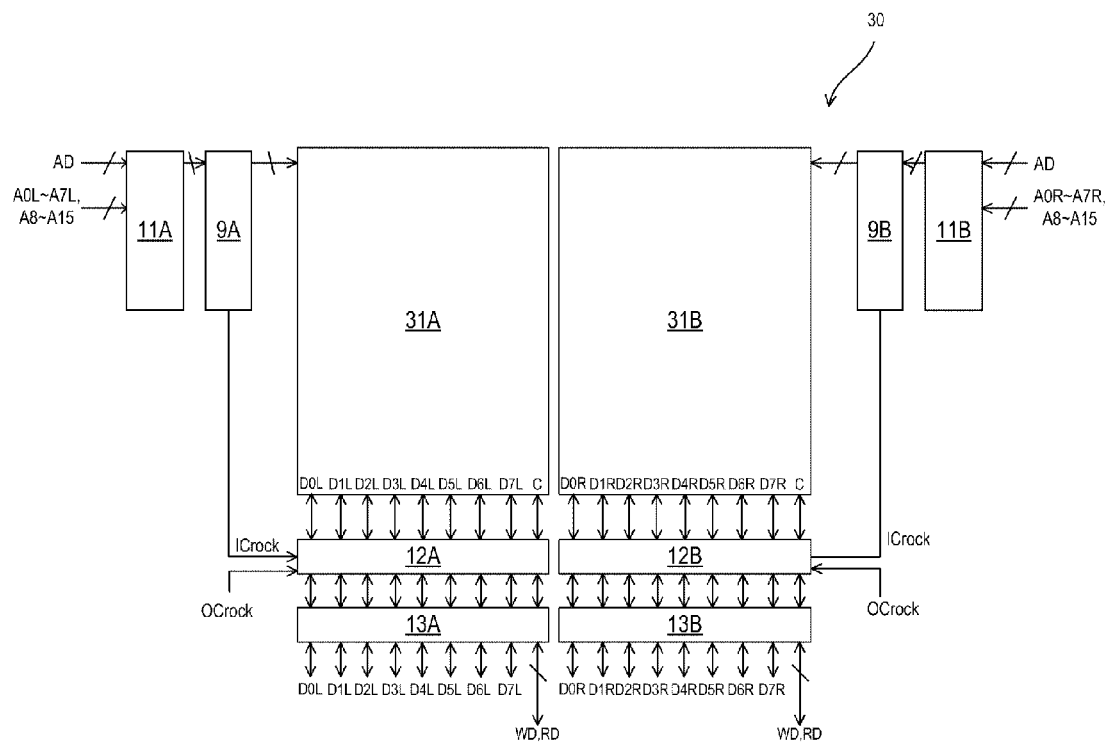
FIG. 19 is a diagram explaining an MRLD which uses the MLUT shown in FIG. 17.

FIG. 19 shows a further detailed circuit example than that of MLUT shown in FIG. 18. The MLUT 30 shown in FIG. 19 includes the memory cell units 31A, 31B, the address decoders 9A, 9B, the address selectors 11A, 11B, the I/O (input/output) buffers 12A, 12B, and the data selectors 13A, 13B. In the MLUT 30, the memory cell units 13A and 31B respectively include an address decoder, an address selector, an I/O and a data selector. The input addresses to the memory cell units 31A and 31B respectively are, addresses A0L to A7L, A8 to A15, and addresses A0R to A7R, A8 to A15. Accordingly, the memory cell units 31A and 31B occupies large capacity of 512K of 16th power of 2 (65, 536) words×8 bits.

In FIG. 18, the memory cell units 31A and 31B respectively include inputs of addresses A0L to A7L, A8 to A15, and addresses A0R to A7R, A8 to A15.

Note that FIG. 18 is a schematic view, and does not show decoders and the like, which are the surrounding circuits of the memory cell units. The decoders 9A, 9B explained with reference to FIG. 19 are prepared for each memory cell unit, and are disposed in between the address selectors 11A, 11B and the memory cell units 31A, 31B, respectively. Accordingly, the decoders may decode the entire addresses output from the address selectors 11A, 11B, 14A, and 14B.

Address selectors 11A, 11B, 14A, and 14B respectively are selection circuits to switch to and from the address line for logic operation, and the address for writing in. Such circuits are required in the case where the memory cells are configured by a single port. When the memory cells are configured by dual ports, a row selector is not necessary. The data selectors 13A, 13B are selection circuits which switch to and from output data and write in data WD.

The MRLD can use a conventional memory device of large capacity without the trial production and manufacturing of a semiconductor device for a dedicated small sized SRAM. When the MRLD is configured by a chip, a memory IP (Intellectual Property) is used. However, in a minute memory capacity requested by the conventional MLUT, the address decoders and the sense amplifiers occupy large area, whereby the configuration ratio of the memory itself is to be 50% or less. This leads to overhead of the MRLD, and lacks efficiency. In a large capacity memory, the ratio of the address decoders and the sense amplifiers is decreased, whereby the memory usage efficiency is improved. Accordingly, this design suitable for a large capacity memory is efficient in the case of MRLD chip.

Figure 20:
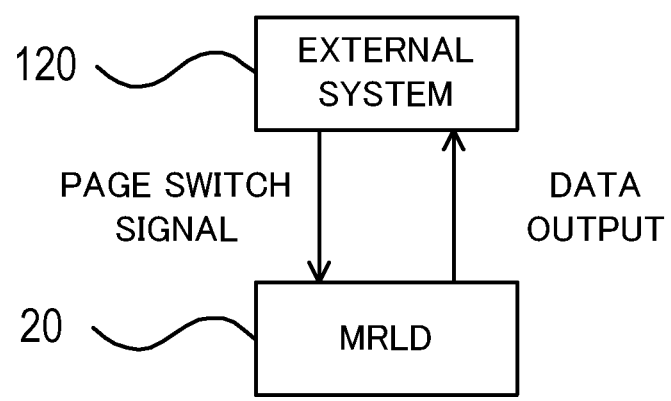
FIG. 20 is a schematic diagram showing one example of connection between an external system and the MRLD.

FIG. 20 is a schematic diagram showing one example of connection between an external system and the MRLD. The external system 120 is an information processing apparatus, or a device realized by an SoC. The external system 120 is connected to the MRLD 20 shown in FIG. 17, receives data output from the MRLD 20, and performs logic calculation to judge page switching. The external system 20 outputs a page switch signal to the addresses A8 to A15 via such connection. The external system mounts an SoC therein, whereby a device with higher function can be realized in cooperation with the MRLD 20.

Second Embodiment

Semiconductor Device Capable of Reconfiguration

Unlike FPGA which has a dedicated switch circuit for each memory cell unit, the MPLD has a memory cell unit, and is capable of being manufactured by a standard CMOS (Complementary Metal Oxide Semiconductor) logic process, whereby the MPLD can be made in lower cost. However, since the MPLD is not a synchronous type, the MPLD cannot satisfy its property when used as the synchronous memory. Accordingly, the applicant proposes an MPLD which is made by a standard manufacturing process of memory cell unit and can be used as a synchronous memory in the Japanese Patent Application Laid-open Publication No. 2013-219699.

In the above mentioned Publication, a pair of memories configured by a synchronous memory which is synchronous with a clock and an asynchronous memory which is asynchronous with the clock is operated as the MLUT which can be switched to and from synchronization and non-synchronization. However, in the standard process, adoption of synchronous memory is preferable.

Embodiments to solve the above mentioned problems are realized by a semiconductor device which uses a synchronous SRAM, is capable of switching to and from synchronization and non-synchronization, and is capable of reconfiguration, as shown in the following item sets.

1. A semiconductor device capable of reconfiguration, characterized by comprising a plurality of logic units which are connected to each other by an address line or a data line, wherein each of the logic units includes:
a plurality of address lines;
a plurality of data lines;
a clock signal line to receive a system clock signal;

a first and a second memory cell units which operate synchronously with the clock signal;
a first address decoder which decodes an address signal and outputs a decode signal to the first memory cell unit;
a second address decoder which decodes an address signal and outputs a decode signal to the second memory cell unit; and
an address transition detection unit which generates an internal clock signal and outputs the internal clock signal to the first memory cell unit, when a transition of the address signal input from the plurality of address lines is detected, wherein the first memory cell unit operates synchronously with the internal clock signal, and the second memory cell unit operates synchronously with the system clock signal.

2. The semiconductor device capable of reconfiguration according to item 1, wherein
the data line connected to the first memory cell unit and the data line connected to the second memory cell unit are connected to each other, and output a logical add, and
the semiconductor device is configured so that when any one of the memory cell units is not used, the entire memory cell unit which is not used is written in with "0".

3. The semiconductor device capable of reconfiguration according to item 1 or 2, which is configured by further comprising:
a third and a fourth memory cell units which operate synchronously with the clock signal;
a third address decoder which decodes an address signal and outputs a decode signal to the third memory cell unit; and
a fourth address decoder which decodes an address signal and outputs a decode signal to the fourth memory cell unit, wherein
the third memory cell unit operates synchronously with the internal clock signal, and the fourth memory cell unit operates synchronously with the system clock signal,
the first and the second address decoders decode an address input from a part of the plurality of address lines, and
the third and the fourth address decoders decode an address input from another part of the plurality of address lines.

4. The semiconductor device capable of reconfiguration according to any one of items 1 to 3, wherein
the memory cell unit stores truth value table data configuring a wiring element and/or a logic element, and operates as a multi look up table.

5. The semiconductor device capable of reconfiguration according to item 4, which stores the truth value table data configured so as not to generate a logic calculation running through the first and the third memory cell units as an inhibition logic.

6. A control method of a semiconductor device capable of reconfiguration, characterized by the semiconductor device capable of reconfiguration comprising a plurality of logic units which are connected to each other by an address line or a data line, wherein
each of the logic units includes:
a plurality of address lines;
a plurality of data lines;
a clock signal line to receive a system clock signal;
a first address decoder;
a second address decoder;
a first memory cell unit including a plurality of memory cells and operates synchronously with the clock signal;
a second memory cell unit including a plurality of memory cells and operates synchronously with the clock signal; and
an address transition detection unit which generates an internal clock signal and outputs the internal clock signal to the first memory cell unit, when a transition of an address signal input from the plurality of address lines is detected, wherein
the first address decoder decodes the address signal, and outputs a decode signal to the first memory cell unit,
the first address decoder decodes the address signal, and outputs a decode signal to the second memory cell unit,
the first memory cell unit operates synchronously with the internal clock signal, and
the second memory cell unit operates synchronously with the system clock signal.

7. The control method of the semiconductor device capable of reconfiguration according to item 6, wherein
the data line connected to the first memory cell unit and the data line connected to the second memory cell unit are connected to each other, and output a logical add, and
the semiconductor device is configured so that when any one of the memory cell units is not used, the entire memory cell unit which is not used is written in with "0".

8. The control method of the semiconductor device capable of reconfiguration according to item 6 or 7, the semiconductor device being configured by further comprising:
a third and a fourth memory cell units which operate synchronously with the clock signal;
a third address decoder which decodes the address signal and outputs the decode signal to the third memory cell unit; and
a fourth address decoder which decodes the address signal and outputs the decode signal to the fourth memory cell unit, wherein
the third memory cell unit operates synchronously with the internal clock signal, and the fourth memory cell unit operates synchronously with the system clock signal,
the first and the second address decoders decode an address input from a part of the plurality of address lines, and
the third and the fourth address decoders decode an address input from another part of the plurality of address lines.

9. The control method of the semiconductor device capable of reconfiguration according to any one of items 6 to 8, wherein
the memory cell unit stores truth value table data configuring a wiring element and/or a logic element, and operates as a multi look up table.

10. A program to control a semiconductor device capable of reconfiguration, characterized by the semiconductor device comprising a plurality of logic units which are connected to each other by an address line or a data line, wherein
each of the logic units includes:
a plurality of address lines;
a plurality of data lines;
a clock signal line to receive a system clock signal;
a first address decoder;
a second address decoder;
a first memory cell unit including a plurality of memory cells and operates synchronously with the clock signal;
a second memory cell unit including a plurality of memory cells and operates synchronously with the clock signal; and
an address transition detection unit which generates an internal clock signal and outputs the internal clock signal to the first memory cell unit, when a transition of an address signal input from the plurality of address lines is detected, wherein the first address decoder decodes the address signal, and outputs a decode signal to the first memory cell unit, the first address decoder decodes the address signal, and outputs a decode signal to the second memory cell unit, the first memory cell unit operates synchronously with the internal clock signal, the second memory cell unit operates synchronously with the system clock signal, the data line connected to the first memory cell unit and the data line connected to the second memory cell unit are connected to each other, and output a logical add, and each of the first and the second memory cell units stores a program configuring truth value table data, and is configured as a logic element and/or a connection element, and wherein the program makes the first or the second memory cell unit execute:

processing to operate as a logic circuit by outputting a logic calculation of a value stored in a memory cell specified by the address line connected by one side to a data line connected to an opposite of the one side; and processing to operate so that, when any one of the memory cell units is not used, the entire memory cell unit which is not used is made to output "0".

11. A storage medium which stores the program according to item 19.

Hereinbelow, the semiconductor device which is capable of reconfiguration is described with reference to the drawings.

1. Semiconductor Device which is Capable of Reconfiguration

The semiconductor device capable of reconfiguration as the second embodiment includes an MLUT, although the MLUT described here is a bidirectionally disposed MLUT, which has the same functional configuration as the MLUT described with reference to FIGS. 16 and 17. However, unlike the above mentioned bidirectionally disposed MLUT, the semiconductor device includes a memory cell unit for synchronous operation and a memory cell unit for asynchronous operation. The memory cell unit for synchronous operation or the memory cell unit for asynchronous operation configures a pair, although the memory cell unit which is to operate as the logic element and/or the connection element is either one of them. The data output of both memory cell units are connected by wired OR connection or an OR circuit, whereby the data of entirely "0" is stored in the memory cell unit which is not operating.

Figure 21:
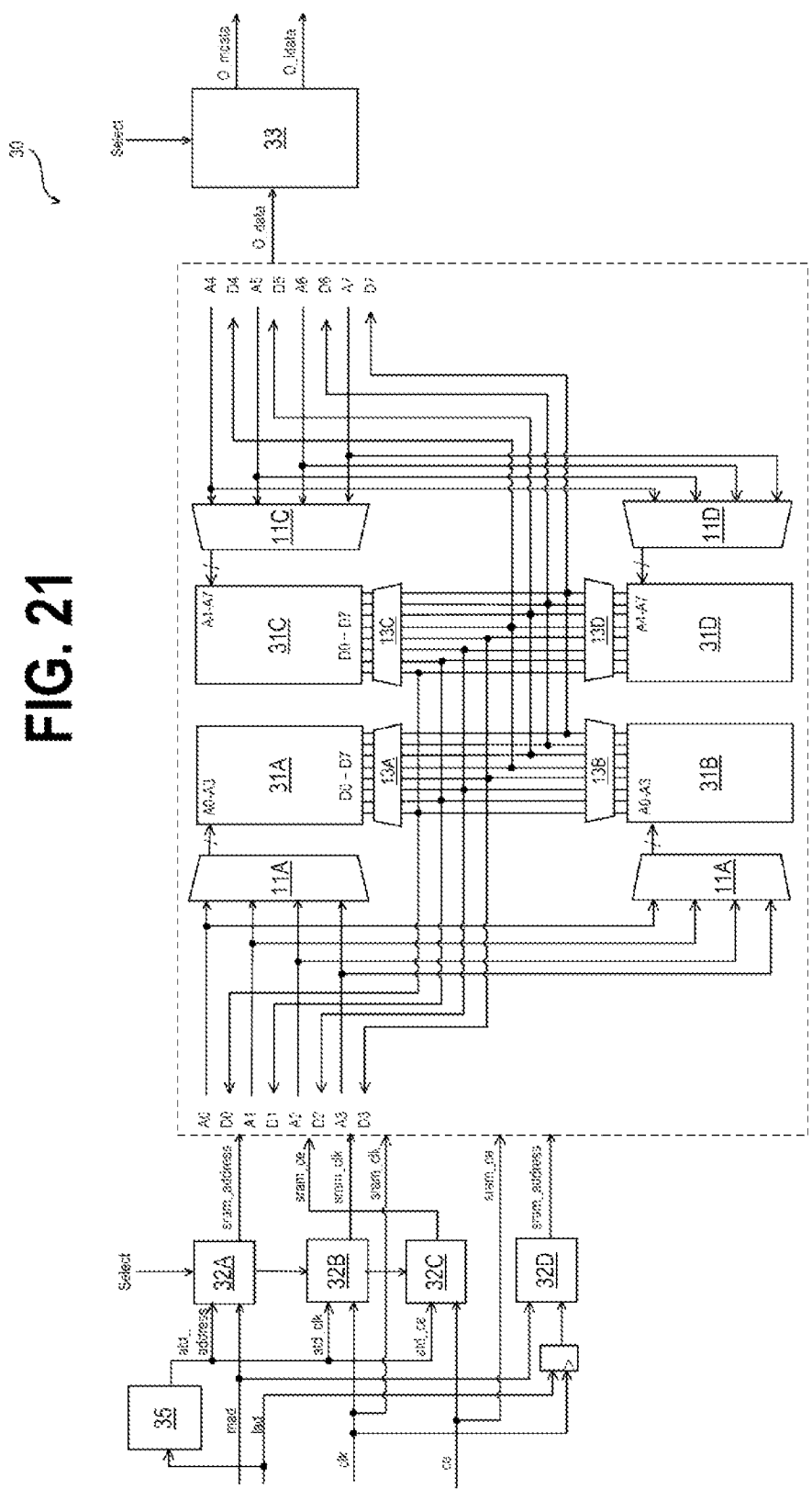
FIG. 21 is a diagram showing an example of a circuit of the MLUT which can switch to and from synchronization and non-synchronization according to a second embodiment.

FIG. 21 is a diagram showing a circuit example of MLUT in which synchronization and non-synchronization can be switched to and from each other. The MLUT 30 shown in FIG. 21 includes memory cell units 31A-31D, address decoders 11A-11D, I/O (input/output) buffers 13A-13D, selection circuits 32A-32D, a data selection circuit 33, an address transition detection unit 35, and a selection circuit 36. The address transition detection unit 35 includes an ATD (Address Transition Detector) circuit, and compares the logic address transmitted with a clock to the logic address transmitted the last time, whereby the address transition is detected. The address transition detection unit 35 is the same as that shown in FIG. 3.

1.1 Signal Line

The signal lines shown in FIG. 21 are described in the following Table 1.

TABLE 1

| Signal name | Bit length | IO | Description |
|---|---|---|---|
| mad | <5:0> | I | Memory address |
| lad | I | I | Logic address |
| clk | I | I | Crock |
| ce | I | I | SRAM chip ebable |
| we | I | I | SRAM write enable |
| i_data | <7:0> | I | SRAM write data |
| odata | <7:0> | O | SRAM data output (x4) |
| o_mdata | <7:0> | O | SRAM data output |
| o_ldata | <7:0> | O | logic data output |
| atd_ck | — | — | ATD creation crock |
| atd_ce | — | — | ATD creation chip select |
| atd_address | — | — | ATD lad ratch address |
| sram_ck(sync) | — | — | Real SRAM crock (synchronous) |
| sram_ck(async) | — | — | Real SRAM crock (unsynchronous) |
| sram_ce(sync) | — | — | SRAM chip select (synchronous) |
| sram_ce(async) | — | — | SRAM chip select (asynchronous) |
| sram_address(sync) | <3:0> | — | SRAM address input (synchronous) |
| sram_address(async) | <3:0> | — | SRAM address input (asynchronous) |
| SELECT | — | — | select signal |

1.2 Synchronous/Asynchronous Memory Cell Unit

The memory cell units 31A-31D are synchronous SRAMs. Each of the memory cell units 31A-31D stores truth value table data so as to be connected in the left direction and right direction. The memory cell units 31B and 31D operate in synchronization with the system clock. On the other hand, the memory cell units 31A and 31C operate in synchronization with an ATD generation clock (which is referred to as "internal clock signal") generated by the address transition circuit 35 which is described later, and thus operate asynchronously with the clock (system clock). The ATD generation clock operates in higher frequency than the system clock signal, whereby the memory cell units 31A and 31C appear to operate asynchronously from the outside of MLUT 30, to provide function of non-synchronization.

Except the function requirements of synchronization, the memory cell units 31A and 31C have the same function as the memory cell units 31A and 31B shown in FIGS. 18 and 19. The same applies to the memory cell units 31B and 31D.

The address decoders 11A and 11B both decode addresses A0-A3 input from the left side, and respectively output the decode signals to the memory cell units 31A and 31B, whereby activate the word lines of the memory cell units 31A and 31B.

The address decoders 11C and 11D both decode addresses A4-A7 input from the right side, and respectively output the decode signals to the memory cell units 31C and 31D, whereby activate the word lines of the memory cell units 31C and 31D.

Further, the address decoders 11A and 11C decode SRAM address asynchronous signal (sram_address(async)), the address decoders 11A and 11C decode SRAM address synchronous signal (sram_address(sync)), whereby the word line of the memory cell unit specified by the decode signal is activated.

In the example shown in FIG. 21, each memory cell unit is a memory block of 16 words×8 bits. In the memory cell units 31A and 31B, 16 words×8 bits×2 is used in the synchronous mode, and 16 words×8 bits×2 can be used in the asynchronous mode. The synchronization and non-synchronization cannot be performed simultaneously, and for example, when logic data is written into the synchronous operation memory cell unit, it is required that the entire asynchronous memory cell units be written in with "0".

Note that the data output of the memory cell unit may be performed by the shown wired OR, or an OR logic circuit may be provided.

1.3 Selection Circuit

The selection conditions of the selection circuit are shown in the following table.

TABLE 3

| Truth value table 1 | | | | Truth value table 2 | | | |
|---|---|---|---|---|---|---|---|
| Case | A0 | A1 | D0 | Case | A0 | A4 | D0 |
| a | 0 | 0 | 0 | a | 0 | 0 | 0 |
| b | 0 | 1 | 0 | b | 0 | 1 | 0 |
| c | 1 | 0 | 0 | c | 1 | 0 | 0 |
| d | 1 | 1 | 1 | d | 1 | 1 | 1 |

The selection circuits 32A-32D are circuits which select operation of asynchronous operation memory cell units 31A and 31C, or the synchronous operation memory cell units 31B and 31D.

When asynchronous operation is selected, the selection circuit 32A selects ATDlad latch address (S11 shown in FIG. 3) generated by the address transition circuit 35 by the selection signal (Select), and outputs the same as the SRAM address asynchronous signal (sram_address(async)). When asynchronous operation is not selected, the logic address is output as it is.

When asynchronous operation is selected, the selection circuit 32B selects an ATD generation clock generated by the address transition circuit 35 by the selection signal (Select), and outputs the same. When asynchronous operation is not selected, the clock is output as it is.

When asynchronous operation is selected, the selection circuit 32C selects an ATD generation chip select generated by the address transition circuit 35 by the selection signal (Select), and outputs the same. When asynchronous operation is not selected, the SRAM chip enable is output as it is.

When synchronous operation is selected by the selection signal (Select), the selection circuit 32D outputs the logic address as it is.

1.4 Inhibition Logic

Further, there is an inhibition logic configuration as a characteristic of dividing memories. The needs for the inhibition logic are described by using two truth value tables shown in Table. 2.

TABLE 2

| sram_ck | | | |
|---|---|---|---|
| mlctrl | sram_ck (async) | mlctrl | sram_ck (sync) |
| 0 | atd_clk | — | clk |
| 1 | clk | | |

*mlctrl = 0/.1: Logic mode/Config mode

| sram_ce | | | | | |
|---|---|---|---|---|---|
| reset | mlctrl | sram_ce (async) | reset | mlctrl | sram_ce (sync) |
| 1 | 0 | atd_ce | 1 | 0 | 0 |
| 1 | 1 | ce | 1 | 1 | ce |
| 0 | 1 | 0 | 0 | 1 | 0 |
| Other than the above | | 1 | Other than the above | | 1 |

*In reset = 0, address = 0 of all SRAM is read, once the output are held.

TABLE 2-continued

| sram_address | | | | | |
|---|---|---|---|---|---|
| reset | mlctrl | sram_address (async) | reset | mlctrl | sram_address (sync) |
| 1 | 0 | atd_address | 1 | 0 | lad |
| 1 | 1 | mad | 1 | 1 | mad |
| Other than the above | | 0 | Other than the above | | 0 |

In truth value table 1, a truth value table is shown in which AND circuit is configured by using A0 and A1, and is output to D0. In truth value table 2, a truth value table is shown in which AND circuit is configured by using A0 and A4, and is output to D0. The logic in the case of truth value table 1 can be subjected to logic calculation only by the memory cell unit 31A for the use of A3-A0. Accordingly, as long as "0" is written into other memory cell units, there is no influence from the output values of the other memory cell units by the OR calculation, whereby the problem of inhibition logic does not occur.

On the other hand, in the case of the logic of truth value table 2, the memory cell unit for the use of A3-A0 cannot identify c and d. Further, the SRAM for the use of A7-A4 cannot identify b and d. Accordingly, the logic calculation performed by running through two memory cell units cannot obtain correct value from two truth value tables. Thus, the logic calculation running through two memory cell units are set as an inhibition logic. Therefore, when performing logic configuration, the logic needs to be realized inside each memory cell unit. Then, the truth value table data according to the present embodiment is generated so that the above mentioned inhibition logic is not generated.

1.5 I/O Buffer

I/O (input/output) buffers 13A-13D synchronize with a clock and any one of the ATD generation clocks, read out data from the data line of the memory cell unit, whereby provide function of FE. Note that the I/O (input/output) buffers 13A-13D include a sense amplifier which amplifies voltage output from the bit line of the memory cell.

The selection circuit 33 outputs SRAM data output (odata) as either one of SRAM data output and logic data output in accordance with the selection signal.

2. Generation Method of Truth Value Table Data

The truth value table data to be applied to the semiconductor device which is capable of reconfiguration described by using the first and the second embodiments is generated by an information processing apparatus which executes software programs for logic configuration.

Figure 22:
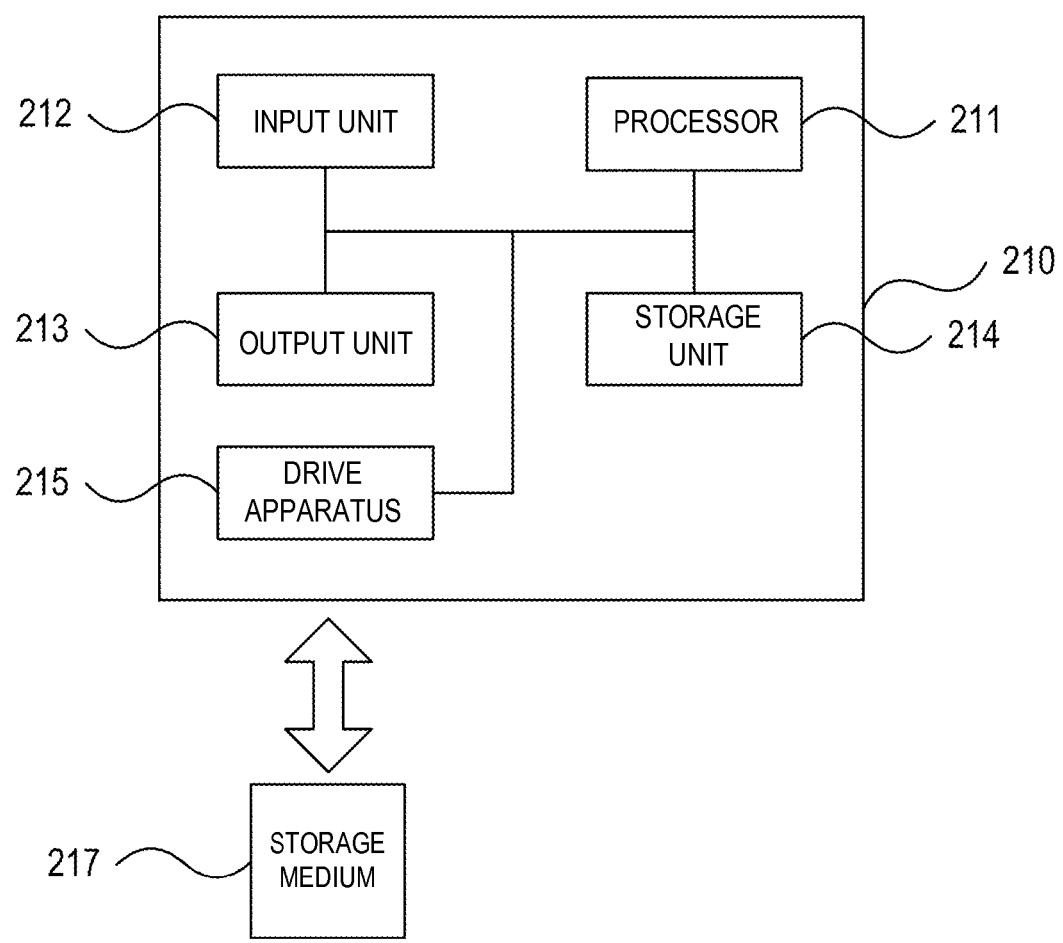
FIG. 22 is a diagram showing one example of a hardware configuration of an information processing apparatus.

FIG. 22 shows one example of a hardware configuration of the information processing apparatus. The information processing apparatus 210 includes a processor 211, an input unit 212, an output unit 213, a storage unit 214, and a drive apparatus 215. The processor 211 stores software for arrangements and wiring input to the input unit 212, circuit description languages such as C language description or hardware description language (HDL) to design integrated circuit, and the truth value table data generated by executing such software, in the storage unit 214. Further, the processor 211 executes the software for arrangements and wiring, performs processing of the arrangements and wiring as described below for the circuit description stored in the storage unit 214, and outputs the truth value table data to the output unit 213. The output unit 213 can be connected to a semiconductor device 20 which is capable of reconfiguration (not shown in FIG. 22), and the processor 211 executes logic configuration processing, whereby the generated truth value table data is written into the semiconductor device 20 capable of reconfiguration via the output unit 213. The output unit 213 may be connected to an external network. In such case, the software program for logic configuration is transmitted and received via the network. The drive apparatus 215 is, for example, an apparatus which reads out and writes in a storage medium 217 such as a DVD (Digital Versatile Disc), a flash memory, and the like. The drive apparatus 215 includes a motor to rotate the storage medium 217, a head which reads out and writes in data on the storage medium 217, and the like. Note that the storage medium 217 can store programs for logic configuration or the truth value table data. The drive apparatus 215 reads out programs from the set storage medium 217. The processor 211 stores the programs or the truth value table data read out by the drive apparatus 215 in the storage unit 214.

The truth value table data is read into the semiconductor device 20, whereby the functions as the logic element and/or the connection element are constructed by specific means in which the truth value table data and the hardware resources cooperate with each other. Further, the truth value table data is data having a structure indicating logic structure of the truth value table.

Although the embodiments of the present invention have been described in detail, it should be understood that the various changes, substitutions, and alterations could be made hereto without departing from the spirit and scope of the invention. Especially, in the logic or connection operation, it should be understood that the changes the operation of Bidirectionally disposed MLUT to that of Multidirectionally disposed MLUT could be made.

DESCRIPTION OF SYMBOLS

20 MRLD
30 MLUT
31 memory cell unit
11 address decoder
35, 100 address transition detection unit
200 processor

What is claimed is:

1. A semiconductor device capable of reconfiguration, characterized by comprising a plurality of logic units which are connected to each other by an address line or a data line, wherein
each of the logic units includes:
a plurality of address lines;
a plurality of data lines;
a clock signal line to receive a system clock signal;
a first and a second memory cell units which operate synchronously with the clock signal;
a first address decoder which decodes an address signal and outputs a decode signal to the first memory cell unit;
a second address decoder which decodes an address signal and outputs a decode signal to the second memory cell unit; and
an address transition detection unit which generates an internal clock signal and outputs the internal clock signal to the first memory cell unit, when a transition of the address signal input from the plurality of address lines is detected, wherein
the first memory cell unit operates synchronously with the internal clock signal, and the second memory cell unit operates synchronously with the system clock signal.

2. The semiconductor device capable of reconfiguration according to claim 1, wherein
the data line connected to the first memory cell unit and the data line connected to the second memory cell unit are connected to each other, and output a logical add, and
the semiconductor device is configured so that when any one of the memory cell units is not used, the entire memory cell unit which is not used is written in with "0".

3. The semiconductor device capable of reconfiguration according to claim 1, which is configured by further comprising:
a third and a fourth memory cell units which operate synchronously with the clock signal;
a third address decoder which decodes an address signal and outputs a decode signal to the third memory cell unit; and
a fourth address decoder which decodes an address signal and outputs a decode signal to the fourth memory cell unit, wherein
the third memory cell unit operates synchronously with the internal clock signal, and the fourth memory cell unit operates synchronously with the system clock signal,
the first and the second address decoders decode an address input from a part of the plurality of address lines, and
the third and the fourth address decoders decode an address input from another part of the plurality of address lines.

4. The semiconductor device capable of reconfiguration according to claim 1, wherein
the memory cell unit stores truth value table data configuring a wiring element and/or a logic element, and operates as a multi look up table.

5. The semiconductor device capable of reconfiguration according to claim 4, which stores the truth value table data configured so as not to generate a logic calculation running through the first and the third memory cell units as an inhibition logic.

6. A control method of a semiconductor device capable of reconfiguration, characterized by the semiconductor device capable of reconfiguration comprising a plurality of logic units which are connected to each other by an address line or a data line, wherein
each of the logic units includes:
a plurality of address lines;
a plurality of data lines;
a clock signal line to receive a system clock signal;
a first address decoder;
a second address decoder;
a first memory cell unit including a plurality of memory cells and operates synchronously with the clock signal;
a second memory cell unit including a plurality of memory cells and operates synchronously with the clock signal; and
an address transition detection unit which generates an internal clock signal and outputs the internal clock signal to the first memory cell unit, when a transition of an address signal input from the plurality of address lines is detected, wherein
the first address decoder decodes the address signal, and outputs a decode signal to the first memory cell unit,
the first address decoder decodes the address signal, and outputs a decode signal to the second memory cell unit, the first memory cell unit operates synchronously with the internal clock signal, and the second memory cell unit operates synchronously with the system clock signal.

7. The control method of the semiconductor device capable of reconfiguration according to claim 6, wherein the data line connected to the first memory cell unit and the data line connected to the second memory cell unit are connected to each other, and output a logical add, and the semiconductor device is configured so that when any one of the memory cell units is not used, the entire memory cell unit which is not used is written in with "0".

8. The control method of the semiconductor device capable of reconfiguration according to claim 6, the semiconductor device being configured by further comprising:

a third and a fourth memory cell units which operate synchronously with the clock signal;

a third address decoder which decodes the address signal and outputs the decode signal to the third memory cell unit; and a fourth address decoder which decodes the address signal and outputs the decode signal to the fourth memory cell unit, wherein the third memory cell unit operates synchronously with the internal clock signal, and the fourth memory cell unit operates synchronously with the system clock signal, the first and the second address decoders decode an address input from a part of the plurality of address lines, and the third and the fourth address decoders decode an address input from another part of the plurality of address lines.

9. The control method of the semiconductor device capable of reconfiguration according to claim 6, wherein the memory cell unit stores truth value table data configuring a wiring element and/or a logic element, and operates as a multi look up table.

10. A non-transitory storage medium which stores a program to control a semiconductor device capable of reconfiguration, characterized by the semiconductor device comprising a plurality of logic units which are connected to each other by an address line or a data line, wherein each of the logic units includes:
a plurality of address lines;
a plurality of data lines;
a clock signal line to receive a system clock signal;
a first address decoder;
a second address decoder;
a first memory cell unit including a plurality of memory cells and operates synchronously with the clock signal;
a second memory cell unit including a plurality of memory cells and operates synchronously with the clock signal; and
an address transition detection unit which generates an internal clock signal and outputs the internal clock signal to the first memory cell unit, when a transition of an address signal input from the plurality of address lines is detected, wherein the first address decoder decodes the address signal, and outputs a decode signal to the first memory cell unit, the first address decoder decodes the address signal, and outputs a decode signal to the second memory cell unit, the first memory cell unit operates synchronously with the internal clock signal, the second memory cell unit operates synchronously with the system clock signal, the data line connected to the first memory cell unit and the data line connected to the second memory cell unit are connected to each other, and output a logical add, and each of the first and the second memory cell units stores a program configuring truth value table data, and is configured as a logic element and/or a connection element, and wherein the program makes the first or the second memory cell unit execute:

processing to operate as a logic circuit by outputting a logic calculation of a value stored in a memory cell specified by the address line connected by one side to a data line connected to an opposite of the one side; and processing to operate so that, when any one of the memory cell units is not used, the entire memory cell unit which is not used is made to output "0".

* * * * *